(12) United States Patent
Takachi

(10) Patent No.: US 11,437,423 B2
(45) Date of Patent: *Sep. 6, 2022

(54) IMAGE SENSOR, MANUFACTURING METHOD, AND ELECTRONIC DEVICE

(71) Applicant: SONY CORPORATION, Tokyo (JP)

(72) Inventor: Taizo Takachi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/909,372

(22) Filed: Jun. 23, 2020

(65) Prior Publication Data

US 2020/0321380 A1 Oct. 8, 2020

Related U.S. Application Data

(63) Continuation of application No. 16/069,848, filed as application No. PCT/JP2017/000567 on Jan. 11, 2017.

(30) Foreign Application Priority Data

Jan. 22, 2016 (JP) .................. 2016-010576

(51) Int. Cl.
*H01L 27/146* (2006.01)
*H01L 27/14* (2006.01)

(52) U.S. Cl.
CPC ........ *H01L 27/14634* (2013.01); *H01L 27/14* (2013.01); *H01L 27/146* (2013.01); *H01L 27/14618* (2013.01); *H01L 27/14625* (2013.01); *H01L 27/14685* (2013.01); *H01L 27/14687* (2013.01); *H01L 27/14623* (2013.01)

(58) Field of Classification Search
CPC ......... H01L 27/14634; H01L 27/14687; H01L 27/146; H01L 27/14; H01L 27/14618; H01L 27/14625; H01L 27/14685; H01L 27/14623

See application file for complete search history.

(56) References Cited

U.S. PATENT DOCUMENTS

| | | |
|---|---|---|
| 2006/0023108 A1 | 2/2006 | Watanabe et al. |
| 2008/0303048 A1 | 12/2008 | Hsieh |
| 2011/0234830 A1* | 9/2011 | Kiyota .............. H01L 27/14634 348/222.1 |
| 2013/0026591 A1 | 1/2013 | Iwafuchi |
| 2013/0181313 A1 | 7/2013 | Nagata et al. |
| 2015/0085094 A1* | 3/2015 | Fujimori ................. H01L 24/32 348/65 |
| 2017/0092880 A1 | 3/2017 | Kwon |
| 2017/0179182 A1 | 6/2017 | Jun |
| 2019/0019831 A1* | 1/2019 | Takachi ............... H01L 27/146 |

* cited by examiner

*Primary Examiner* — Robert G Bachner
(74) *Attorney, Agent, or Firm* — Sheridan Ross P.C.

(57) ABSTRACT

The present technology relates to an image sensor, a manufacturing method and an electronic device capable of preventing a ghost. In the image sensor, a plate-like transparent member larger than a sensor chip in size is affixed to a side of a pixel array unit of the sensor chip having the pixel array unit in which pixels that perform photoelectric conversion are arrayed. The present technology can be applied to a case of capturing an image by receiving light, regardless of whether the light is visible light or not.

26 Claims, 21 Drawing Sheets

IMAGE SENSOR, MANUFACTURING METHOD, AND ELECTRONIC DEVICE

CROSS REFERENCE TO RELATED APPLICATIONS

This application is a continuation of U.S. patent application Ser. No. 16/069,848 filed Jul. 12, 2018, which is a national stage application under 35 U.S.C. 371 and claims the benefit of PCT Application No. PCT/JP2017/000567 having an international filing date of 11 Jan. 2017, which designated the United States, which PCT application claimed the benefit of Japanese Patent Application No. 2016-010576 filed 22 Jan. 2016, the entire disclosures of each of which are incorporated herein by reference.

TECHNICAL FIELD

The present technology relates to an image sensor, a manufacturing method and an electronic device, and more particularly, to an image sensor, a manufacturing method and an electronic device capable of preventing a ghost, for example.

BACKGROUND ART

For example, Patent Document 1 describes making a cross section of a transparent member trapezoidal for an image sensor in which a plate-like transparent member such as glass, is arranged on a light receiving surface and light is made incident on the surface through the transparent member.

By making the cross section of the transparent member arranged on the light receiving surface trapezoidal as described in Patent Document 1, it is possible to prevent a ghost caused by light which is reflected by the end surface of the transparent member and made incident on the light receiving surface.

CITATION LIST

Patent Document

Patent Document 1: JP 2006-041183 A

SUMMARY OF THE INVENTION

Problems to be Solved by the Invention

In a chip size package (CSP) or the like which is a package as an image sensor, various circuits are reduced in size due to the development of semiconductor miniaturization process. Thus, a distance between the end surface of a sensor chip, which has a pixel array unit in which pixels that perform photoelectric conversion are arrayed, and the pixel array unit is shortened.

In a case where the distance between the end surface of the sensor chip and the pixel array unit is not so short, the reflected light reflected by the end surface of the transparent member is incident between the end surface of the sensor chip and the pixel array unit (outside the pixel array unit). However, in a case where the distance between the end surface of the sensor chip and the pixel array unit is short, the reflected light reflected by the end surface of the transparent member is incident on (the inside of) the pixel array unit, possibly causing a ghost.

The present technology has been made in light of such a situation and can prevent a ghost from occurring.

Solutions to Problems

An image sensor according to the present technology is an image sensor including: a sensor chip having a pixel array unit in which pixels that perform photoelectric conversion are arrayed; and a plate-like transparent member is affixed to a side of the pixel array unit of the sensor chip and is larger than the sensor chip in size.

In the image sensor according to the present technology, the plate-like transparent member larger than the sensor chip in size is affixed to the sensor chip having the pixel array unit in which the pixels that perform photoelectric conversion are arrayed.

A manufacturing method according to the present technology is a manufacturing method including: a step of affixing a plate-like transparent member, to a side of a pixel array unit of a sensor chip having the pixel array unit in which pixels that perform photoelectric conversion are arrayed, in which an image sensor, in which the sensor chip and the transparent member larger than the sensor chip in size are affixed, is manufactured.

In the manufacturing method according to the present technology, the plate-like transparent member is affixed to the side of the pixel array unit of the sensor chip having the pixel array unit in which the pixels that perform photoelectric conversion are arrayed, and the image sensor, in which the sensor chip and the transparent member larger than the sensor chip in size are affixed, is manufactured.

An electronic device according to the present technology is an electronic device including: an optical system which collects light; and an image sensor which receives the light and captures an image, in which the image sensor includes: a sensor chip having a pixel array unit in which pixels that perform photoelectric conversion are arrayed; and a plate-like transparent member which is affixed to a side of the pixel array unit of the sensor chip and is larger than the sensor chip in size.

In the electronic device according to the present technology, in the image sensor, the plate-like transparent member larger than the sensor chip in size is affixed to the sensor chip having the pixel array unit in which the pixels that perform photoelectric conversion are arrayed.

Note that the image sensor may be an independent apparatus or an internal block constituting one apparatus.

Effects of the Invention

According to the present technology, it is possible to prevent a ghost.

Note that the effects described herein are not necessarily limited, and any one of the effects described in the present disclosure may be applied.

MODE FOR CARRYING OUT THE INVENTION

<Embodiment of Camera Unit to which the Present Technology is Applied>

Figure 1:
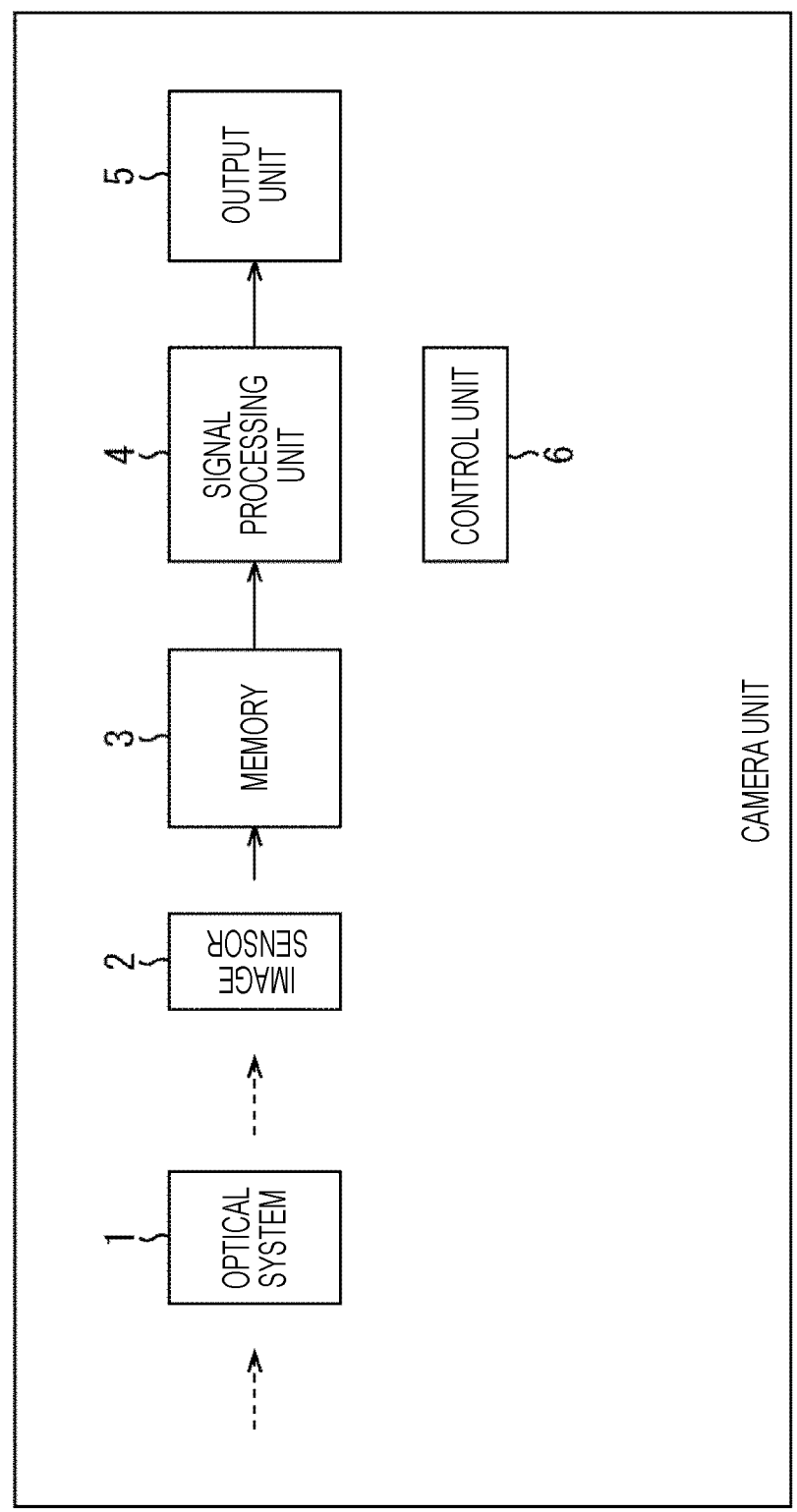
FIG. 1 is a block diagram showing a configuration example of an embodiment of a camera unit to which the present technology is applied.

FIG. 1 is a block diagram showing a configuration example of an embodiment of a camera unit to which the present technology is applied.

Note that the camera unit can capture both a still image and a moving image.

In FIG. 1, the camera unit has an optical system 1, an image sensor 2, a memory 3, a signal processing unit 4, an output unit 5 and a control unit 6.

The optical system 1 has, for example, a zoom lens, a focus lens, a diaphragm and the like (all not shown) and make light from the outside incident on the image sensor 2.

The image sensor 2 is, for example, a complementary metal oxide semiconductor (CMOS) image sensor with a back surface wiring structure, receives the incident light from the optical system 1, performs photoelectric conversion and outputs image data corresponding to the incident light from the optical system 1.

The memory 3 temporarily stores the image data outputted by the image sensor 2.

The signal processing unit 4 performs, for example, processings such as noise removal, white balance adjustment and the like as signal processings using the image data stored in the memory 3 and supplies the image data to the output unit 5.

The output unit 5 outputs the image data from the signal processing unit 4.

That is, the output unit 5 has a display (not shown) constituted by, for example, liquid crystals or the like, and displays an image corresponding to the image data from the signal processing unit 4 as a so-called through image.

Moreover, the output unit 5 has, for example, a driver (not shown) which drives a recording medium such as a semiconductor memory, a magnetic disk, an optical disk or the like and records image data from the signal processing unit 4 on the recording medium.

Furthermore, the output unit 5 has a communication interface, which performs predetermined communication, and transmits the image data from the signal processing unit 4 with or without wire.

The control unit 6 controls each block constituting the camera unit according to a user operation, an instruction from the outside, or the like.

In the camera unit configured as described above, the image sensor 2 receives the incident light from the optical system 1 and outputs the image data according to that incident light.

The image data outputted by the image sensor 2 is supplied to the memory 3 and stored therein. The image data stored in the memory 3 is subjected to the signal processings by the signal processing unit 4, and the image data obtained as a result is supplied to the output unit 5 and outputted.

<Configuration Example of Image Sensor 2>

Figure 2:
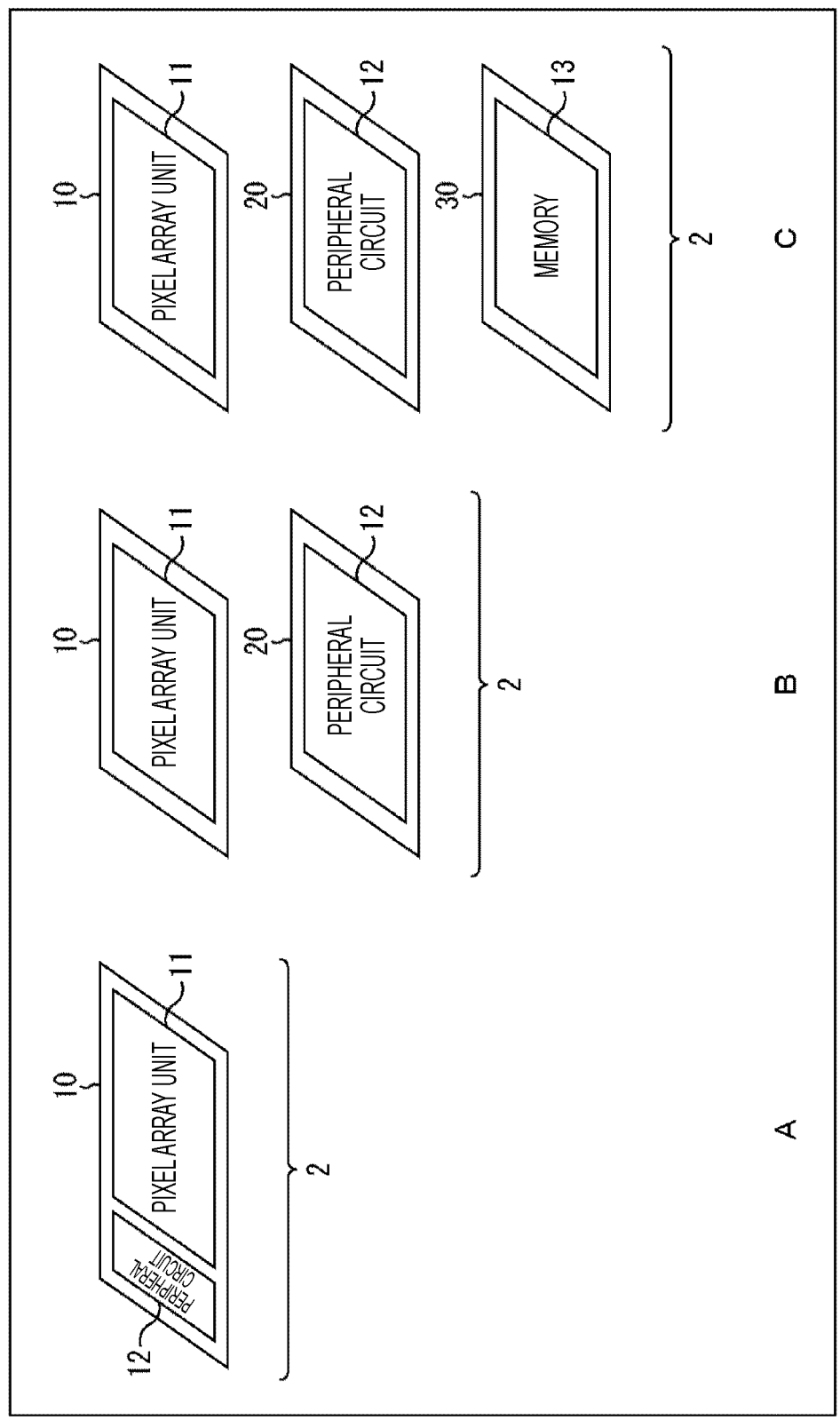
FIG. 2 is a perspective view showing the outline of a configuration example of the image sensor 2.

FIG. 2 is a perspective view showing the outline of a configuration example of the image sensor 2.

The image sensor can be configured with one die (substrate) or can be configured by laminating a plurality of dies.

A of FIG. 2 shows a configuration example of the image sensor 2 configured with one die.

In A of FIG. 2, the image sensor 2 is configured with a sensor die 10 which is one flat die.

In the sensor die 10, a pixel array unit 11, in which a plurality of pixels (not shown) that perform photoelectric conversion are arrayed in matrix, and a peripheral circuit are formed. The peripheral circuit includes a drive circuit to drive the pixels of the pixel array unit 11, and circuits and the like which perform other necessary signal processings (including control) to capture an image.

B of FIG. 2 shows a configuration example of the image sensor configured with two dies.

In B of FIG. 2, the image sensor 2 has a laminate structure of two layers in which a sensor die 10 and a logic die 20, which are two flat dies, are laminated.

A pixel array unit 11 is formed in the sensor die 10, and a peripheral circuit 12 is formed in the logic die 20.

C of FIG. 2C shows a configuration example of the image sensor configured with three dies.

In C of FIG. 2, the image sensor 2 has a laminate structure of three layers in which a sensor die 10, a logic die 20 and a memory die 30, which are three flat dies, are laminated.

A pixel array unit 11 is formed in the sensor die 10, and a peripheral circuit 12 is formed in the logic die 20. A memory 13 is formed in the memory die 30.

In the case of configuring the image sensor 2 with the laminate structure as shown in B and C of FIG. 2, a peripheral circuit is not required to be included in the sensor die 10 so that the sizes (areas) of the sensor die 10 and accordingly, the image sensor 2 can be reduced.

Moreover, in the case of configuring the image sensor 2 with the laminate structure, it is possible to shorten wires between the pixel array unit 11 and the peripheral circuit 12, reduce the time constant due to the capacitance, and achieve high speed.

Furthermore, in the case of configuring the image sensor 2 with the laminate structure, various image processings can be possible within the image sensor 2 by providing the memory die 30 in which the memory 13 is formed as in C of FIG. 2, and an image with added value and information regarding the image can be outputted.

Hereinafter, for example, the image sensor 2 having the laminate structure of two layers in which the sensor die 10 and the logic die 20 are laminated as in B of FIG. 2 will be described as an example.

Note that, in addition to the image sensor 2 having the laminate structure of two layers, the present technology can be applied to, for example, the image sensor 2 not having a laminate structure as shown in A of FIG. 2, the image sensor 2 having the laminate structure of three layers as shown in C of FIG. 2, an image sensor having a laminate structure of four or more layers, and an image sensor with any other configurations.

Figure 3:
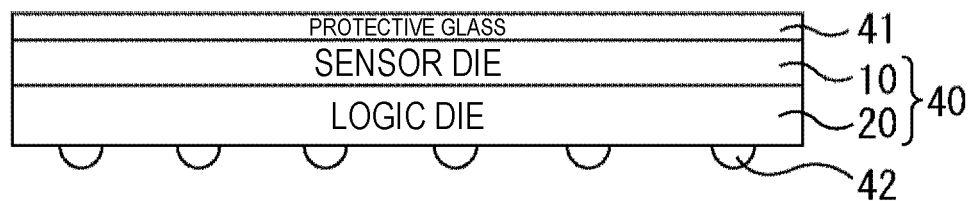
FIG. 3 is a cross-sectional view showing the outline of a configuration example of an image sensor having a laminate structure of two layers.

FIG. 3 is a cross-sectional view showing the outline of a configuration example of an image sensor having a laminate structure of two layers.

In FIG. 3, of the sensor die 10 and the logic die 20, the sensor die 10 and the logic die 20 are affixed, in which the sensor die 10 is placed as an upper side (the side on which the light received by the image sensor is incident), so as to configure a sensor chip 40 with a laminate structure of two layers.

Moreover, in FIG. 3, the image sensor of (wafer level) chip size package (CSP) is configured by affixing a protective glass 41 with the same size as the sensor chip 40 on the upper side (sensor die 10 side) of the sensor chip 40 and forming (back surface) electrodes 42 under (logic die 20 side) the sensor chip 40.

Since the electrodes 42 are formed under the sensor chip 40 in FIG. 3 as described above, the image sensor can be mounted by flip chip.

Figure 4:
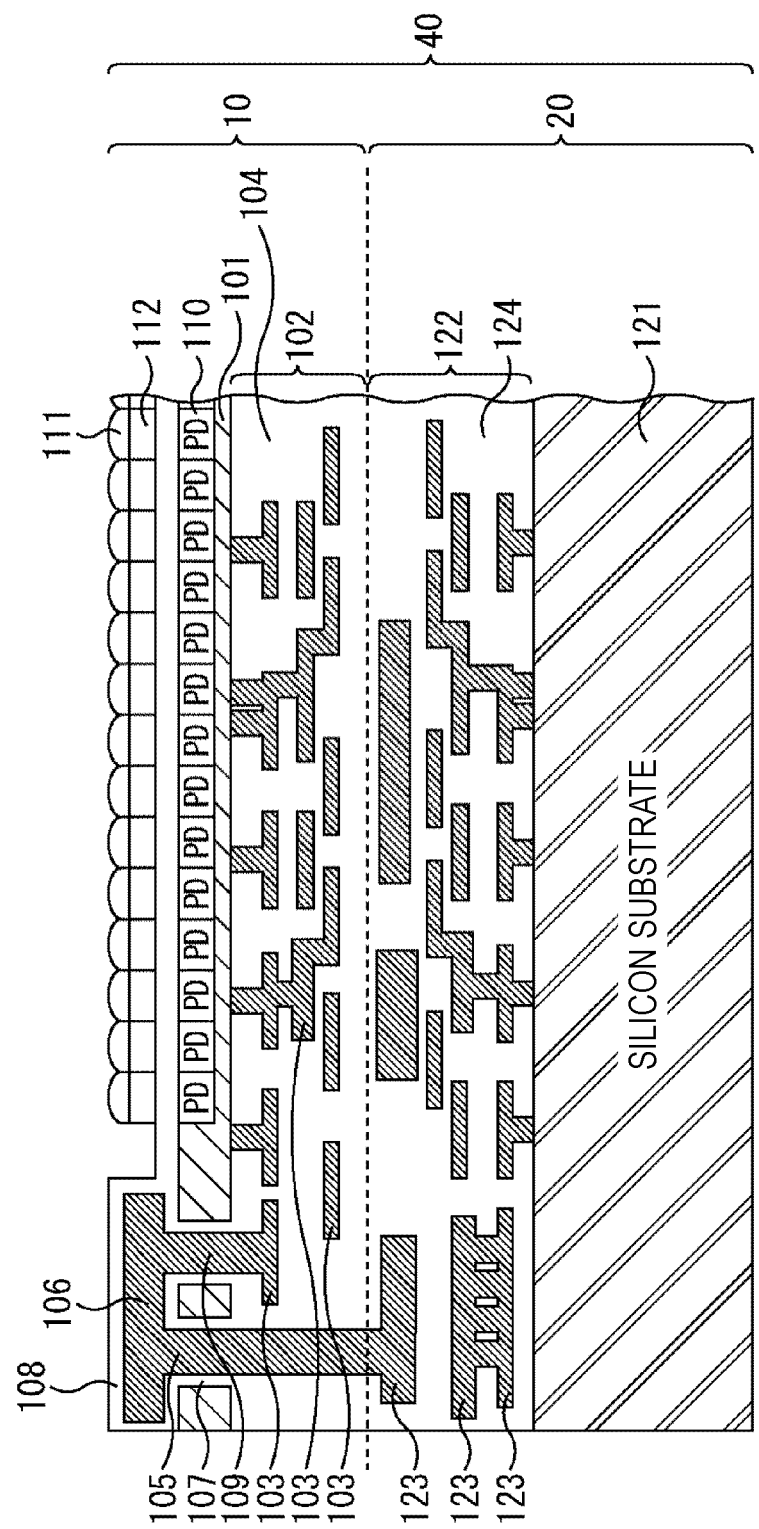
FIG. 4 is a cross-sectional view showing a configuration example of a sensor chip 40.

FIG. 4 is a cross-sectional view showing a configuration example of the sensor chip 40.

That is, FIG. 4 is a partial enlarged view of the cross section of the sensor chip 40.

In the logic die 20, a multilayer wiring layer 122 is formed on the upper side (sensor die 10 side) of a semiconductor substrate 121 (hereinafter referred to as a silicon substrate 121) including, for example, silicon (Si). A part of the peripheral circuit 12 in FIG. 2 is configured by this multilayer wiring layer 122.

The multilayer wiring layer 122 is configured with a plurality of wiring layers 123, which include an uppermost wiring layer closest to the sensor die 10, an intermediate wiring layer, a lowermost wiring layer closest to the silicon substrate 121 and the like, and interlayer insulating films 124 formed between each of the wiring layers 123.

The plurality of wiring layers 123 are formed by using, for example, copper (Cu), aluminum (Al), tungsten (W), or the like, and the interlayer insulating films 124 are formed by, for example, silicon oxide films, silicon nitride films, or the like. The plurality of wiring layers 123 and the interlayer insulating films 124 may be each made by including the same material for all the layers, or two or more materials may be used separately depending on the layers.

The plurality of wiring layers 123 are electrically connected to the electrodes 42 (FIG. 3) through the silicon substrate 121.

In the sensor die 10, a multilayer wiring layer 102 is formed on the lower side (logic die 20 side) of a semiconductor substrate 101 (hereinafter referred to as a silicon substrate 101) including silicon (Si). This multilayer wiring layer 102 constitutes another part of the peripheral circuit 12 such as a readout circuit (not shown) which reads out signals from the pixels and the like.

The multilayer wiring layer 102 is configured with a plurality of wiring layers 103, which include an uppermost wiring layer closest to the silicon substrate 101, an intermediate wiring layer, a lowermost wiring layer closest to the logic die 20 and the like, and interlayer insulating films 104 formed between each of the wiring layers 103.

For the material used as the plurality of wiring layers 103 and the interlayer insulating films 104, the same material as the wiring layers 123 and the interlayer insulating films 124 described above can be adopted. Moreover, the plurality of wiring layers 103 and the interlayer insulating films 104 are similar to the wiring layers 123 and the interlayer insulating films 124 described above in that the wiring layers 103 and the interlayer insulating films 104 may be made by including one material or two or more materials separately.

Note that the multilayer wiring layer 102 of the sensor die 10 is configured with three wiring layers 103 and the multilayer wiring layer 122 of the logic die 20 is configured with four wiring layers 123 in the example in FIG. 4, but the total number of wiring layers is not limited this, and the wiring layers can be formed by any number of layers.

In the silicon substrate 101, photo diodes (PD) 110 serving as the pixels are formed by PN junction.

An insulating film (planarizing film) 108 is formed on the upper surface of the silicon substrate 101, and on chip lenses (OCL) 111 and color filters (CF) 112 are formed at portions of the upper part of the insulating film 108 corresponding to the PDs 51.

At predetermined positions of a portion of the silicon substrate 101 where the OCLs 111 and the CFs 112 are not formed in the insulating film 108, a silicon through electrode 109, which is connected to the wiring layer 102 of the sensor die 10, and a chip through electrode 105, which is connected to the wiring layer 122 of the logic die 20, are formed.

The chip through electrode 105 and the silicon through electrode 109 are connected by a connecting wire 106 formed on the upper surface side of the silicon substrate 101. Moreover, insulating films 107 are formed between each of the silicon through electrode 109 and the chip through electrode 105 and the silicon substrate 101.

The sensor chip 40 has a laminate structure in which the multilayer wiring layer 122 side of the logic die 20 and the multilayer wiring layer 102 side of the sensor die 10 are affixed. In FIG. 4, the affixing surfaces of the multilayer wiring layer 122 of the logic die 20 and the multilayer wiring layer 102 of the sensor die 10 are indicated by a broken line.

<First Configuration Example of Image Sensor 2>

Figure 5:
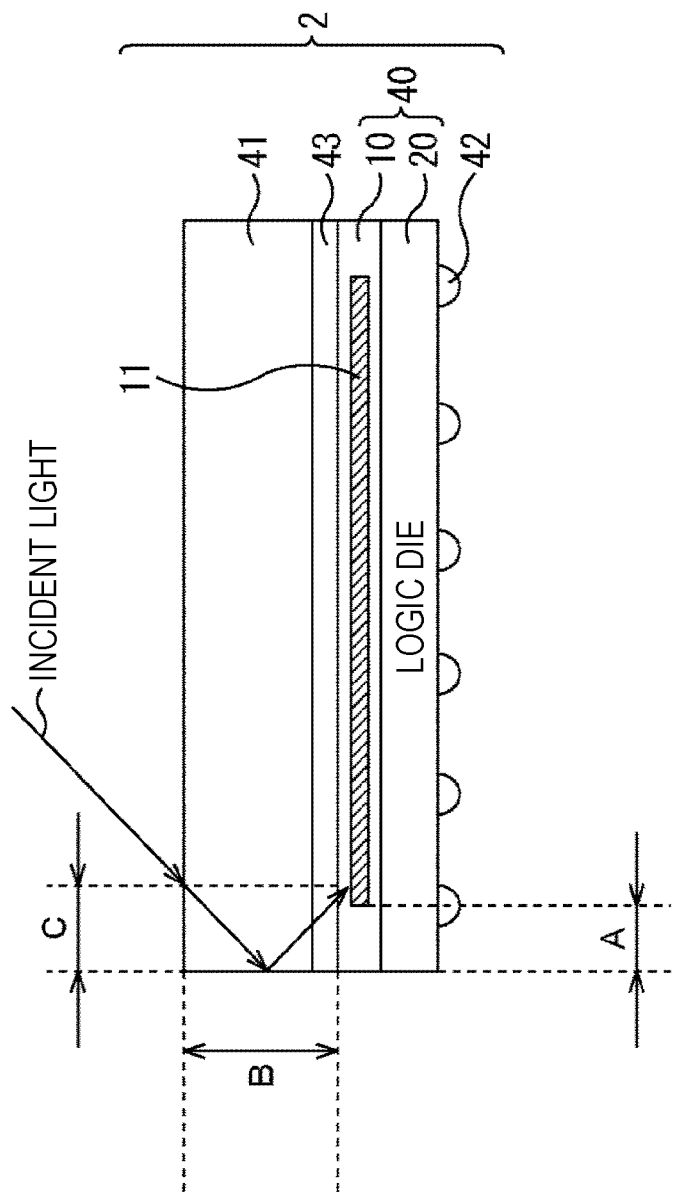
FIG. 5 is a cross-sectional view showing a first configuration example of the image sensor 2.

FIG. 5 is a cross-sectional view showing a first configuration example of the image sensor 2.

Note that portions in the drawing corresponding to those in FIG. 3 are denoted by the same reference signs, and the descriptions thereof will be omitted as appropriate hereinafter.

In FIG. 5, the image sensor 2 has a sensor chip 40 with a laminate structure of two layers of a sensor die 10 and a logic die 20, a protective glass 41 and electrodes 42.

Therefore, the image sensor 2 in FIG. 5 is configured similarly to the image sensor in FIG. 3.

Note that the protective glass 41 is affixed to the sensor die 10 of the sensor chip 40 by using a transparent adhesive 43. Although FIG. 5 shows the adhesive 43, the illustration of the adhesive 43 is omitted in FIG. 3.

Herein, the distance between the end surface of the sensor chip 40 and the pixel array unit 11 is denoted by A, and the thickness of the protective glass 41 (and the adhesive 43) is denoted by B.

Further, in a case where incident light with an angle, that is, incident light incident on the protective glass 41 from a direction tilted from the normal direction of the plane as the pixel array unit 11 is reflected by the end surface of the protective glass 41 and is incident on the sensor chip 40, the distance between the position, where that incident light is incident on the sensor chip 40, and the end surface of the sensor chip 40 is denoted by C.

In a case where the distance A is sufficiently longer than the thickness B of the protective glass 41, the relationship between the distances A and C is A>C. The incident light reflected by the end surface of the protective glass 41 is, therefore, not incident on (the inside of) the pixel array unit 11, and a ghost does not occur in the image obtained by the image sensor 2.

Incidentally, due to the development of the semiconductor miniaturization process, the distance A is short.

In the case of configuring the image sensor 2 by forming the peripheral circuit 12 in the logic die 20 different from the sensor die 10 in which the pixel array unit 11 is formed and laminating the sensor die 10 and the logic die 20 as shown in FIG. 2, the distance A is further shorter.

When the distance A is short and the relationship between the distances A and C is A<C as described above, the incident light reflected by the end surface of the protective glass 41 is incident on the pixel array unit 11, and a ghost occurs in the image (hereinafter referred to as the capture image) obtained by the image sensor 2.

Figure 6:
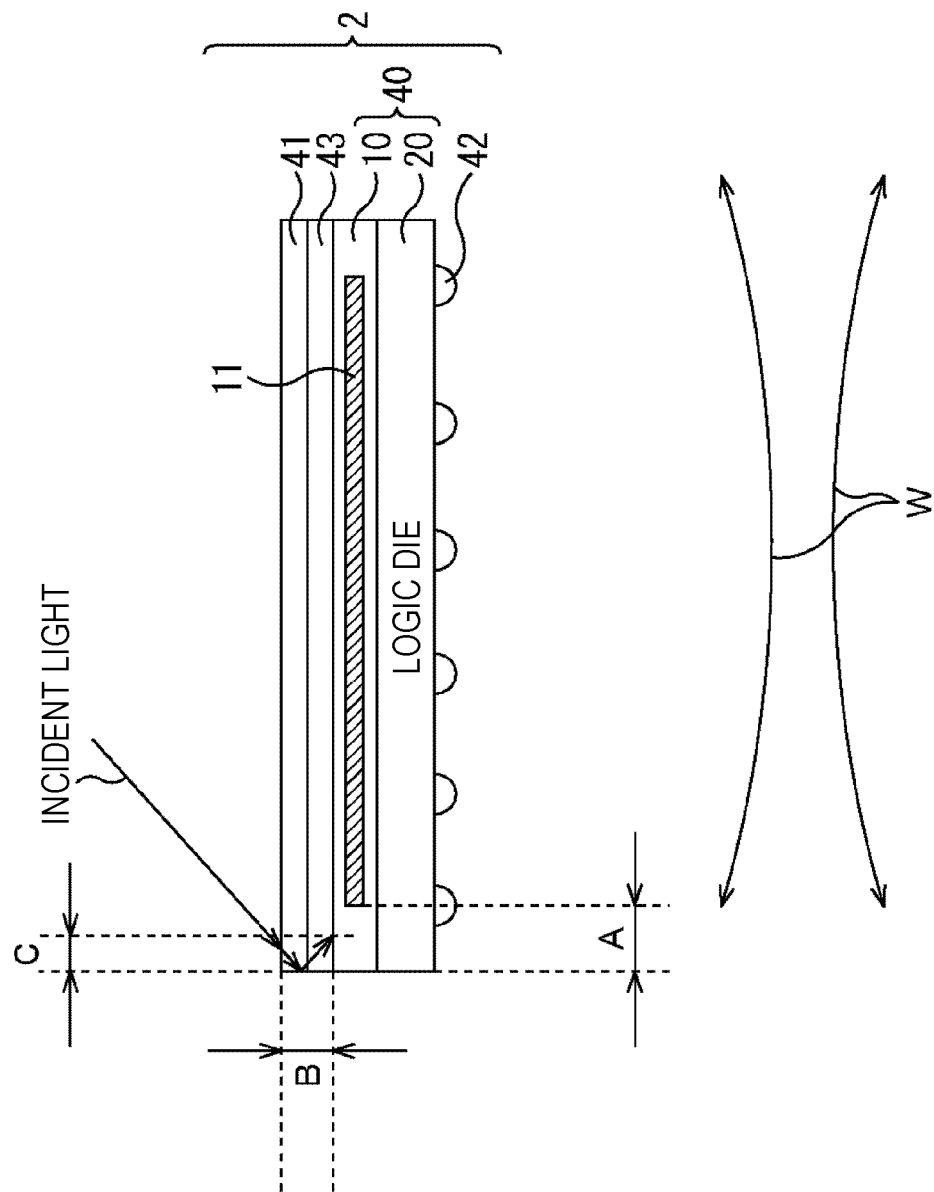
FIG. 6 is a diagram illustrating an example of a method for preventing a ghost from occurring in a captured image.

FIG. 6 is a diagram illustrating an example of a method for preventing a ghost from occurring in the captured image.

That is, FIG. 6 shows a cross section of the image sensor 2 in a state in which the protective glass 41 in FIG. 5 is thinned.

As described with FIG. 5, in the case where the distance A is sufficiently longer than the thickness B of the protective glass 41, the relationship between the distances A and C is A>C so that a ghost does not occur.

Thereupon, as shown in FIG. 6, there is a method for preventing a ghost from occurring by shortening (thinning) the thickness B of the protective glass 41 according to the distance A, which is short as a result of the miniaturization, to maintain the relationship between the distances A and C to A>C.

That is, by shortening the thickness B of the protective glass 41, the relationship between the distances A and C does not become A<C even if the distance A is shortened, and the occurrence of a ghost can be prevented.

However, when the thickness B of the protective glass 41 is shortened, the mechanical rigidity of the image sensor 2 of the CSP is lowered, and warps as indicated by the arrow W in FIG. 6 are prone to occur in the image sensor 2.

When the warps occur in the image sensor 2, the distances between a lens (not shown), which collects light incident on the image sensor 2, and the pixels in the central portion and the pixels in the peripheral portion of the pixel array unit 11 are made different by the degrees of the warps, and the focusing may be varied in (the pixels) of the entire pixel array unit 11 in some cases.

Now, an F value of the lens, a size (horizontal and vertical lengths) of one pixel of the pixel array unit 11, and a focal depth of the lens are denoted by F, a and b, respectively.

Moreover, when the diameter of the permissible circle of confusion is set to a size of (less than) two pixels, the focal depth b of the lens is expressed by the expression $b = F \times 2 \times a$.

For example, in a case where F=2.0 and a=1.2 μm, the focal depth b of the lens is $2 \times 2 \times 1.2 = 4.8$ μm. When the position of the pixel in the optical axis direction is deviated by 4.8 μm or more due to the warps of the image sensor 2, the focusing varies, and a blur occurs in the captured image.

Thereupon, hereinafter, the image sensor 2 which prevents a ghost from occurring in the captured image, which is the image sensor 2 which can prevent the warps of the image sensor 2 due to the lowering of the mechanical rigidity from occurring as well as a blur from occurring in the captured image, will be described.

<Second Configuration Example of Image Sensor 2>

Figure 7:
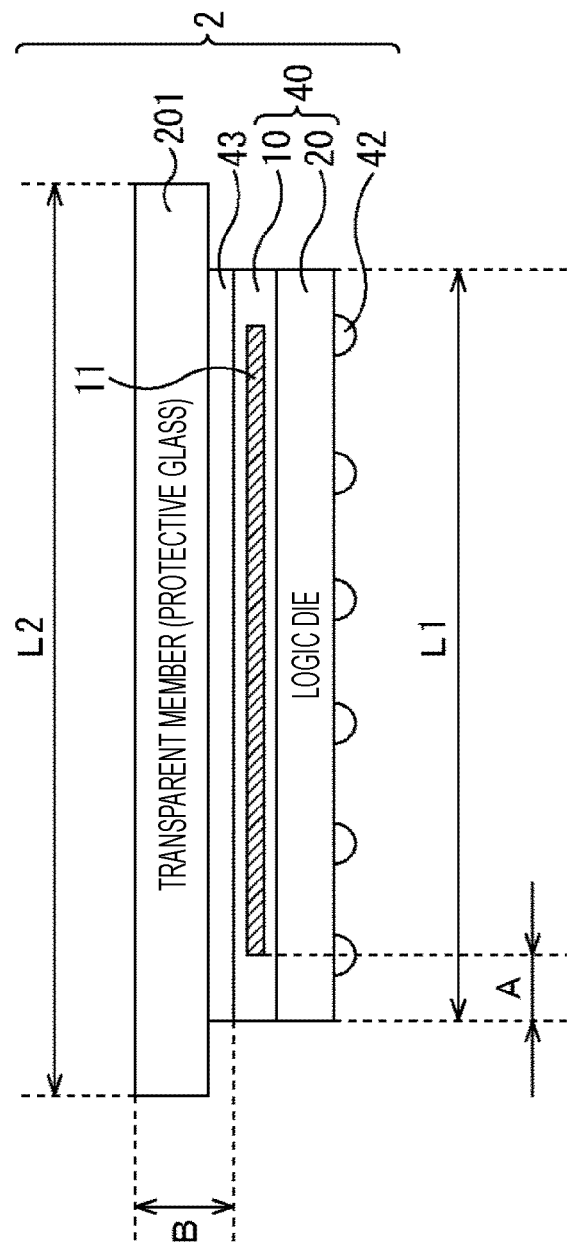
FIG. 7 is a cross-sectional view showing a second configuration example of the image sensor 2.

FIG. 7 is a cross-sectional view showing a second configuration example of the image sensor 2.

Note that portions in the drawing corresponding to those in FIG. 5 are denoted by the same reference signs, and the descriptions thereof will be omitted as appropriate hereinafter.

In FIG. 7, the image sensor 2 has a sensor chip 40 with a laminate structure of two layers of a sensor die 10 and a logic die 20, electrodes 42 and a protective glass 201. Moreover, in the image sensor 2 in FIG. 7, the protective glass 201 is affixed to (the sensor die 10 of) the sensor chip 40 by an adhesive 43.

Therefore, the image sensor 2 in FIG. 7 is common to the case in FIG. 5 in that the image sensor 2 has the sensor chip 40 and the electrodes 42.

However, the image sensor 2 in FIG. 7 is different from the case in FIG. 5 in that the protective glass 201 is provided instead of the protective glass 41.

The protective glass 201 is a plate-like transparent member larger than the sensor chip 40 in size (area of the surface on which the light is incident on the image sensor 2) and is affixed to the sensor chip 40 by the adhesive 43.

Note that the protective glass 201 with the large size can be directly affixed to the sensor chip 40 or can be indirectly affixed to the sensor chip 40. That is, the protective glass 201 can be affixed to the protective glass 41 of the image sensor 2 with the thin protective glass 41 as shown in FIG. 6.

As described above, there is no need to directly affix the protective glass 201 to the sensor chip 40, and some transparent member may be present between the protective glass 201 and the sensor chip 40. The configuration examples of the image sensor 2 described hereinafter are also similar in this respect.

Moreover, in the description hereinafter, for convenience of explanation, the left and right and the up and down of the image sensor 2 are each symmetrical.

Figure 8:
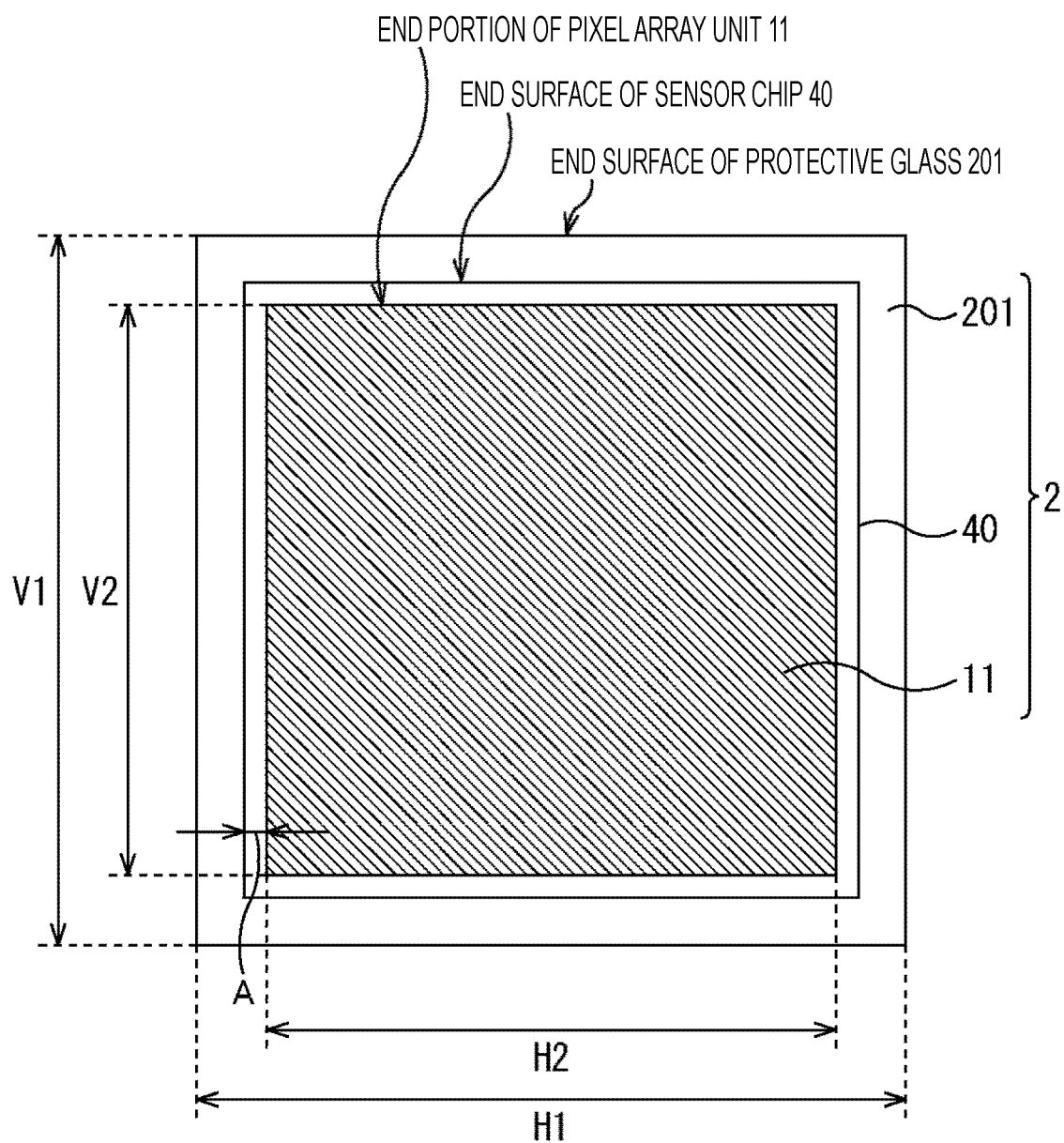
FIG. 8 is a plan view of the second configuration example of the image sensor 2 viewed from the top.

FIG. 8 is a plan view of the second configuration example of the image sensor 2 in FIG. 7 viewed from the top.

In FIG. 8, the protective glass 201 is larger than the sensor chip 40 in size.

That is, a horizontal length H1 and a vertical length V1 of the protective glass 201 are longer than a horizontal length H2 and a vertical length V2 of the sensor chip 40, respectively.

Therefore, the end surface of the protective glass 201 is positioned outside the end surface of the sensor chip 40 as well as the end portion of the pixel array unit 11.

Note that a distance A between the end surface of the sensor chip 40 and the pixel array unit 11 is short in FIG. 8 (and FIG. 7).

Figure 9:
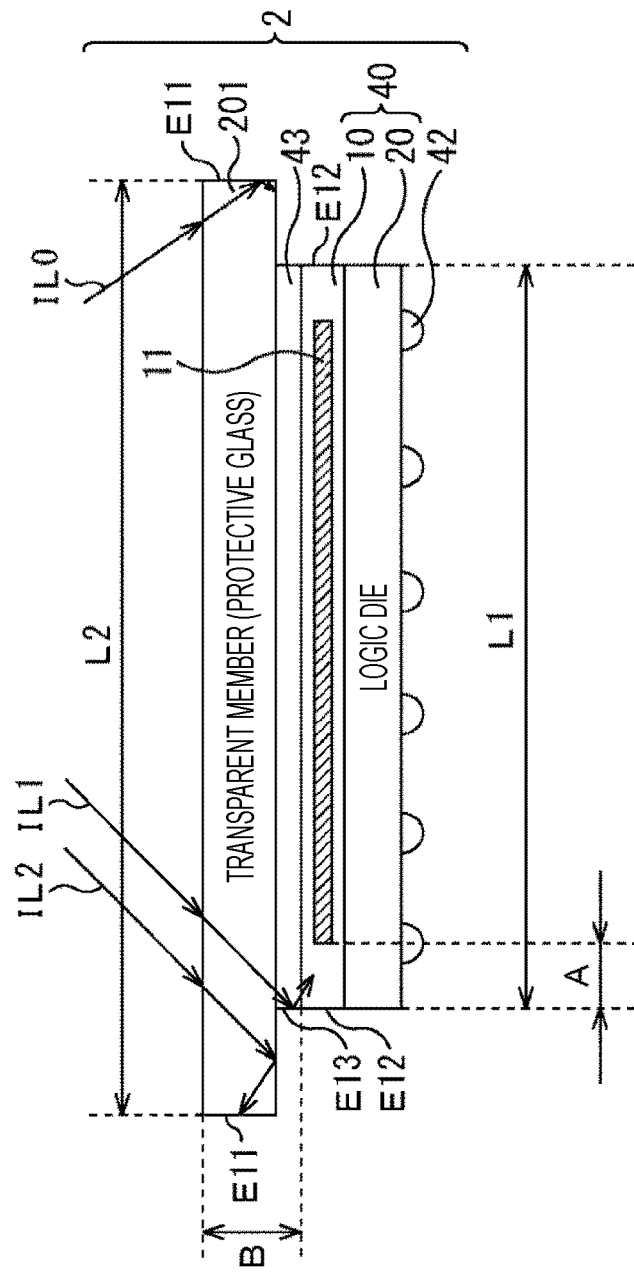
FIG. 9 is a diagram illustrating an example of incident light incident on the second configuration example of the image sensor 2.

FIG. 9 is a diagram illustrating an example of incident light incident on the second configuration example of the image sensor 2 in FIGS. 7 and 8.

In FIG. 9, incident lights IL0, IL1 and IL2 are lights all with angles and lights not incident on the pixel array unit 11 as long as the lights go straight.

In FIG. 9, the incident light IL0 is incident on the protective glass 201 and is reflected by an end surface E11 of that protective glass 201.

The incident light IL0 reflected by the end surface of the protective glass 201 is directed to the inside of the image sensor 2. However, since the end surface E11 of the protective glass 201 is positioned outside an end surface E12 of the sensor chip 40, the incident light IL0 arrives at a position of the lower surface of the protective glass 201 projecting from the sensor chip 40.

That is, since the protective glass 201 is larger than the sensor chip 40 in size, the incident light IL0, which is reflected by the end surface E11 of the protective glass 201 and directed to the inside of the image sensor 2, does not reach the sensor chip 40 nor the pixel array unit 11.

Therefore, it is possible to prevent a ghost from occurring in the captured image due to the incident light reflected by the end surface E11 of the protective glass 201 and incident on the pixel array unit 11.

For the size of the protective glass 201 larger than the size of the sensor chip 40, for example, any size can be adopted as long as the incident light with the maximum angle among the incident lights assumed to be incident on the protective glass 201 is not incident on the pixel array unit 11 even when the incident light is reflected by the end surface E11 of the protective glass 201.

Herein, "the incident light with the maximum angle" described above means the incident light with the maximum inclination from the normal direction of the plane as the pixel array unit 11.

In FIG. 9, the incident light IL1 is incident on the protective glass 201, passes through the lower surface of the protective glass 201, and is reflected by an end portion E13 of the adhesive 43 toward the inside of the image sensor 2.

Since the thickness of the adhesive 43 is extremely thin, even if a distance A between the end surface E12 of the sensor chip 40 and the pixel array unit 11 is short, the incident light IL1 reflected by the end portion E13 of the adhesive 43 does not reach the pixel array unit 11 and arrives between the end surface E12 of the sensor chip 40 and the pixel array unit 11.

Therefore, a ghost due to the incident light IL1 reflected by the end portion E13 of the adhesive 43 does not occur.

In FIG. 9, the incident light IL2 is incident on the protective glass 201 and is reflected by the lower surface of the protective glass 201 toward the outside (the end surface E11 of the protective glass 201) of the image sensor 2.

The incident light IL2 reflected by the lower surface of the protective glass 201 may be possibly reflected by the end surface E11 of the protective glass 201 thereafter, but does not reach the pixel array unit 11 unless the incident light IL2 is light with high intensity (light from a high luminance light source).

In this case, a ghost due to the incident light IL1 reflected by the lower surface of the protective glass 201 does not occur.

Note that, for the thickness B (which may include the adhesive 43) of the protective glass 201, a thickness satisfying the mechanical rigidity required for the image sensor 2 is adopted. As the thickness B of the protective glass 201, for example, 200 µm or more can be adopted.

Figure 10:
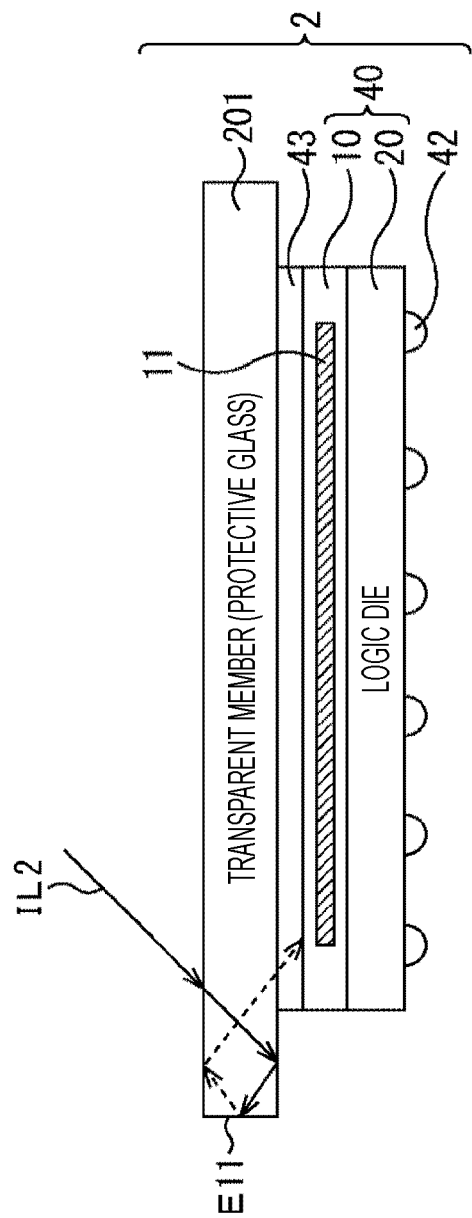
FIG. 10 is a diagram further illustrating the example of the incident light incident on the second configuration example of the image sensor 2.

FIG. 10 is a diagram further illustrating the example of the incident light incident on the second configuration example of the image sensor 2.

As described with FIG. 9, the incident light IL2 reflected by the lower surface of the protective glass 201 may be possibly reflected by the end surface E11 of the protective glass 201 thereafter, but does not reach the pixel array unit 11 unless the incident light IL2 is light with high intensity.

However, in a case where the incident light IL2 is light with high intensity, after reflected by the lower surface of the protective glass 201, the incident light IL2 is further reflected by the end surface E11 of the protective glass 201 and the like and may possibly arrive at the pixel array unit 11.

In FIG. 10, the incident light IL2 reflected by the lower surface of the protective glass 201 is reflected by the end surface E11 of the protective glass 201 and the upper surface of the protective glass 201 thereafter and arrives at the pixel array unit 11. In this case, a ghost occurs in the captured image.

<Third Configuration Example of Image Sensor 2>

Figure 11:
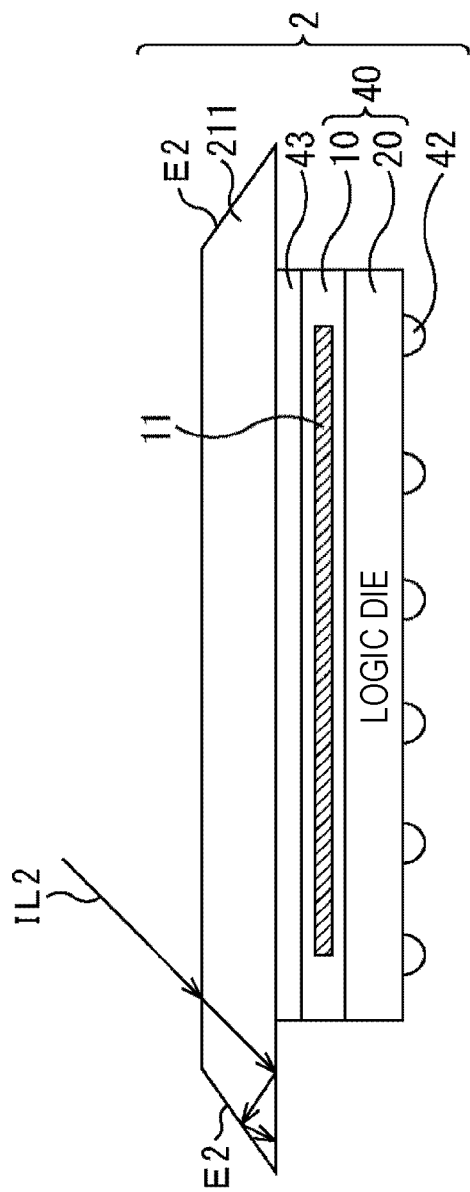
FIG. 11 is a cross-sectional view showing a third configuration example of the image sensor 2.

FIG. 11 is a cross-sectional view showing a third configuration example of the image sensor 2.

That is, as described with FIG. 10, FIG. 11 shows the image sensor 2 which prevents a ghost from occurring due to the incident light incident on the pixel array unit 11 via multiple reflections inside the protective glass 201.

Note that portions in the drawing corresponding to those in FIG. 7 are denoted by the same reference signs, and the descriptions thereof will be omitted as appropriate hereinafter.

In FIG. 11, the image sensor 2 has a sensor chip 40 with a laminate structure of two layers of a sensor die 10 and a logic die 20, electrodes 42 and a protective glass 211. Moreover, in the image sensor 2 in FIG. 11, the protective glass 211 is affixed to the sensor chip 40 by an adhesive 43.

Therefore, the image sensor 2 in FIG. 11 is common to the case in FIG. 7 in that the image sensor 2 has the sensor chip 40 and the electrodes 42.

However, the image sensor 2 in FIG. 11 is different from the case in FIG. 7 in that the protective glass 211 is provided instead of the protective glass 201.

The protective glass 211 is common to the protective glass 201 in that the protective glass 211 is a plate-like transparent member larger than the sensor chip 40 in size.

However, the protective glass 201 and the protective glass 211 are different in that the cross-sectional shape of the protective glass 201 is rectangular whereas the cross-sectional shape of the protective glass 211 is trapezoidal.

In FIG. 11, the protective glass 211 has an isosceles trapezoidal cross-sectional shape in which the inner angles of both ends of the bases (upper base and lower base) are equal.

Moreover, in FIG. 11, the size of the upper surface of the protective glass 211 is larger than the size of the lower surface. Accordingly, the trapezoid as the cross-sectional shape of the protective glass 211 is a trapezoid in which the lower base is longer than the upper base.

Note that the trapezoid of the cross-sectional shape of the protective glass 211 may be not an isosceles trapezoid or may be a trapezoid in which the upper base is longer than the lower base.

Since the cross-sectional shape of the protective glass 211 is trapezoidal, end surfaces E2 are tapered. Therefore, incident light IL2 reflected by the lower surface of the protective glass 211 toward the outside of the image sensor 2 may be possibly reflected by an end surface E2 of the protective glass 211 thereafter. However, the incident light IL2 is reflected by the tapered end surface E2 toward the outside of the image sensor 2.

Therefore, it is possible to suppress the occurrence of a ghost due to the incident light (secondary light, tertiary light and the like) incident on the pixel array unit 11 via multiple reflections inside the protective glass 211.

Note that any cross-sectional shape can be adopted for the cross-sectional shape of the protective glass 211 besides a trapezoid as long as the incident light reflected by the lower surface of the protective glass 211 toward the outside of the image sensor 2 is reflected toward the outside of the image sensor 2. That is, for the cross-sectional shape of the protective glass 211, a tapered shape of the end surfaces E2 of the protective glass 211, such as a parallelogram, can be adopted besides a trapezoid, for example.

<Fourth Configuration Example of Image Sensor 2>

Figure 12:
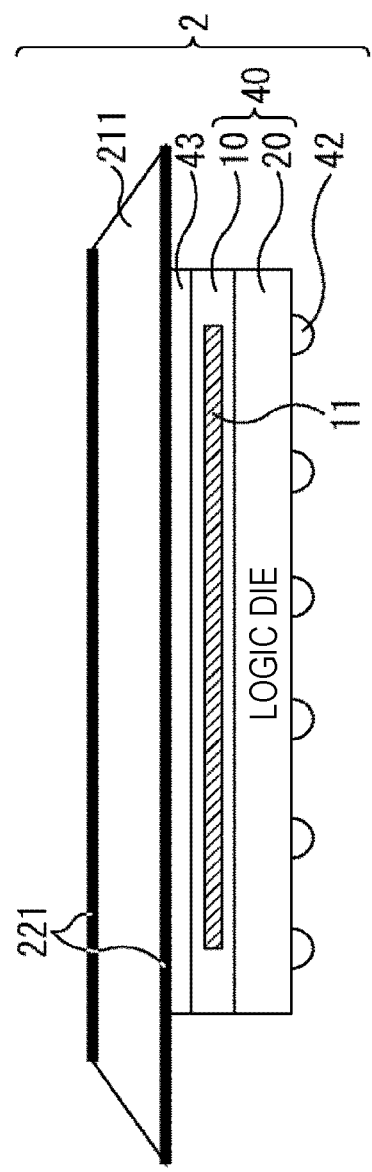
FIG. 12 is a cross-sectional view showing a fourth configuration example of the image sensor 2.

FIG. 12 is a cross-sectional view showing a fourth configuration example of the image sensor 2.

Note that portions in the drawing corresponding to those in FIG. 11 are denoted by the same reference signs, and the descriptions thereof will be omitted as appropriate hereinafter.

In FIG. 12, the image sensor 2 has a sensor chip 40 with a laminate structure of two layers of a sensor die 10 and a logic die 20, electrodes 42 and a protective glass 211. Moreover, in the image sensor 2 in FIG. 12, the protective glass 211 is affixed to the sensor chip 40 by an adhesive 43.

Therefore, the image sensor 2 in FIG. 11 is common to the case in FIG. 11 in that the image sensor 2 has the sensor chip 40, the electrodes 42 and the protective glass 211.

However, the image sensor 2 in FIG. 12 is different from the case in FIG. 11 in that infrared cut filter (IRCF) films 221 are attached to the upper surface and the lower surface of the protective glass 211.

Herein, in each configuration example of the image sensor 2 described hereinafter, as a protective glass affixed to the sensor chip 40, a protective glass with a rectangular cross-sectional shape like the protective glass 201 or a protective glass with a trapezoidal cross-sectional shape like the protective glass 211 is shown as appropriate. However, in each configuration example, any one of the rectangular protective glass and the protective glass with the trapezoidal cross-sectional shape can be adopted as far as possible.

In the image sensor 2 in FIG. 12, the IRCF films 221 are, for example, reflection type IRCFs and can be attached to the upper surface and the lower surface of the protective glass 211 by depositing several tens of layers.

The image sensor 2 in FIG. 12 is an image sensor integrated with the IRCFs, and a thin camera unit (module) can be configured by adding the optical system 1 to such an image sensor 2.

That is, as a method for preventing infrared rays from being incident on the image sensor 2, for example, there is a method for providing an IRCF between the upper side of the image sensor 2, that is, the optical system 1 (FIG. 1) and the image sensor 2 not having the IRCF film 221.

In the case where the IRCF is provided between the optical system 1 and the image sensor 2 as described above, gaps are generated between the optical system 1 and the IRCF and between the IRCF and the image sensor 2, and the thickness of the camera unit becomes longer accordingly. Moreover, according to the gap between the IRCF and the image sensor 2, a lens with a long back focal length is required as a lens constituting the optical system 1, which hinders the thinning.

On the other hand, in the image sensor 2 in which the IRCF films 221 are attached to the protective glass 211 as shown in FIG. 12, there is no gap between the IRCF and the image sensor 2 so that the thickness of the camera unit can be shortened accordingly.

Note that the IRCF films 221 can be attached to any one of the upper surface and the lower surface of the protective glass 211, besides being attached to both of the surfaces.

Herein, the protective glass 211 to which the IRCF films 221 are attached can be manufactured by, for example, depositing several tens of layers forming the IRCF films 221. However, when such deposition is performed, a defective product with a pinhole defect and the like is prone to occur.

Therefore, in a case of manufacturing the image sensor 2 by affixing the sensor chip 40 and the protective glass 211 to which the IRCF films 221 are attached at the wafer level, the yield of the entire image sensor 2 may be deteriorated due to the pinhole defect which is prone to occur at the time of deposition to form the IRCF films 221.

Thereupon, the sensor chip 40 and the protective glass 211 to which the IRCF films 221 are attached are affixed not at the wafer level. The sensor chip 40 and the protective glass 211 to which the IRCF films 221 are attached are both singulated at the wafer level, and the only good pieces selected from among the singulated pieces of both the sensor chip 40 and the protective glass 211 can be affixed.

By affixing the sensor chip 40 and the protective glass 211 to which the IRCF films 221 are attached after selecting only good pieces of the singulated of the pieces as described above, it is possible to prevent the deterioration of the yield and suppress the manufacturing costs.

Note that the IRCF films 221 can be applied to, for example, the protective glass 201 (FIG. 7) with a rectangular cross-sectional shape and the like besides the protective glass 211 with the trapezoidal cross-sectional shape.

<Fifth Configuration Example of Image Sensor 2>

Figure 13:
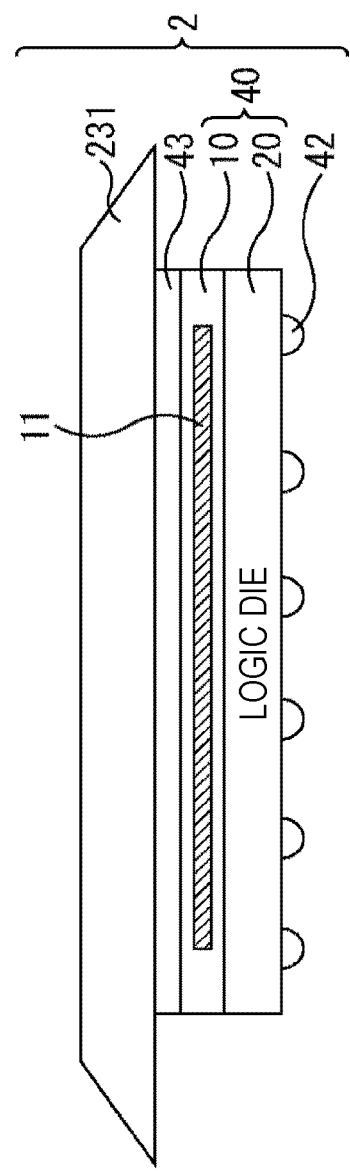
FIG. 13 is a cross-sectional view showing a fifth configuration example of the image sensor 2.

FIG. 13 is a cross-sectional view showing a fifth configuration example of the image sensor 2.

Note that portions in the drawing corresponding to those in FIG. 11 are denoted by the same reference signs, and the descriptions thereof will be omitted as appropriate hereinafter.

In FIG. 13, the image sensor 2 has a sensor chip 40 with a laminate structure of two layers of a sensor die 10 and a logic die 20, electrodes 42 and a protective glass 231. Moreover, in the image sensor 2 in FIG. 13, the protective glass 231 is affixed to the sensor chip 40 by an adhesive 43.

Therefore, the image sensor 2 in FIG. 11 is common to the case in FIG. 11 in that the image sensor 2 has the sensor chip 40 and the electrodes 42.

However, the image sensor 2 in FIG. 13 is different from the case in FIG. 11 in that the protective glass 231 is provided instead of the protective glass 211.

The protective glass 231 is common to the protective glass 211 in that the protective glass 231 is a plate-like transparent member larger than the sensor chip 40 in size and has a trapezoidal cross-sectional shape.

However, the protective glass 231 is different from the protective glass 211 which can adopt any transparent member, in that the protective glass 231 is constituted by a transparent member which absorbs infrared rays, such as a blue plate glass, for example.

Since the protective glass 231 absorbs infrared rays, the protective glass 231 functions as an IRCF. Therefore, like the case in FIG. 12, the image sensor 2 in FIG. 13 is also an image sensor integrated with the IRCF, and, like the case in FIG. 12, a thin camera unit can be also configured by adding the optical system 1 to such an image sensor 2.

Herein, defective products are prone to occur in the manufacturing process of the protective glass 231 which absorbs infrared rays, like the protective glass 211 to which IRCF films 221 are attached in FIG. 12.

Therefore, like the case in FIG. 12, the sensor chip 40 and the protective glass 231 are affixed not at the wafer level. The sensor chip 40 and the protective glass 231 are both singulated at the wafer level, and only good pieces selected from among the singulated pieces of both the sensor chip 40 and the protective glass 231 are affixed. Thus, it is possible to prevent the deterioration of the yield and suppress the manufacturing costs.

In addition, coefficients of thermal expansion (CTE) are greatly different between (the material of) the transparent member, which constitutes the protective glass 231 as the IRCF and absorbs infrared rays, and silicon (Si), which constitutes the sensor chip 40.

Therefore, in a case where the sensor chip 40 and the protective glass 231 are affixed at the wafer level, when back surface wires are formed to connect to the sensor chip 40 to the electrodes 42 thereafter and the sensor chip 40 and the protective glass 231 become very hot, for example, during chemical vapor deposition (CVD) to form the insulating films, a large warp may occur in the entire wafer and the manufacturing of the image sensor 2 may become possibly difficult.

By affixing the sensor chip 40 and the protective glass 231 after the sensor chip 40 and the protective glass 231 are singulated, it is possible to prevent the difficulty of the manufacturing of the image sensor 2 as described above.

Note that the transparent member which absorbs infrared rays can be applied to, for example, a protective glass with a rectangular cross-sectional shape, like the protective glass 201 (FIG. 7), and the like besides a protective glass with a trapezoidal cross-sectional shape, like the protective glass 231.

<Sixth Configuration Example of Image Sensor 2>

Figure 14:
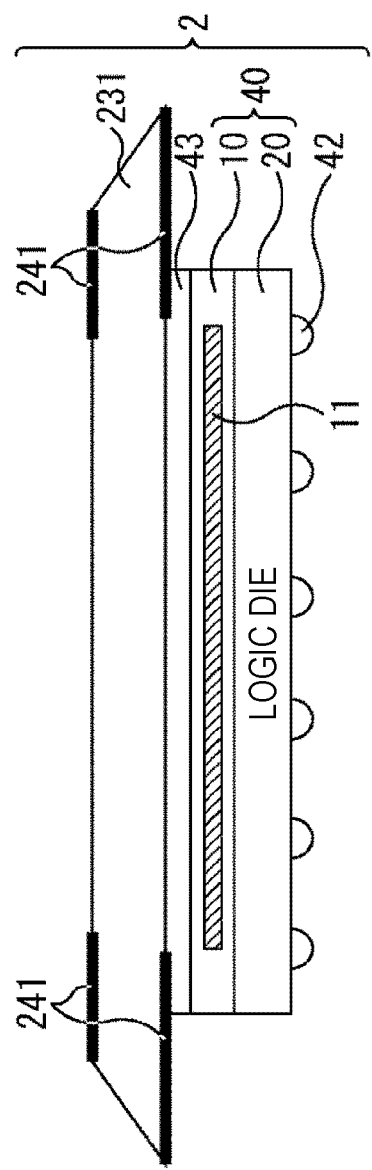
FIG. 14 is a cross-sectional view showing a sixth configuration example of the image sensor 2.

FIG. 14 is a cross-sectional view showing a sixth configuration example of the image sensor 2.

Note that portions in the drawing corresponding to those in FIG. 13 are denoted by the same reference signs, and the descriptions thereof will be omitted as appropriate hereinafter.

In FIG. 14, the image sensor 2 has a sensor chip 40 with a laminate structure of two layers of a sensor die 10 and a logic die 20, electrodes 42 and a protective glass 231. Moreover, in the image sensor 2 in FIG. 14, the protective glass 231 is affixed to the sensor chip 40 by an adhesive 43.

Therefore, the image sensor 2 in FIG. 14 is common to the case in FIG. 13 in that the image sensor 2 has the sensor chip 40, the electrodes 42 and the protective glass 231.

However, the image sensor 2 in FIG. 14 is different from the case in FIG. 13 in that light shielding films 241 are formed at the peripheral portions of both the upper surface and the lower surface of the protective glass 231.

The light shielding films 241 are formed at the peripheral portions of both the upper surface and the lower surface of the protective glass 231 so as not to block the light directly incident on a pixel array unit 11, that it, light which is not reflected inside the protective glass 231, but penetrates the protective glass 231 and is incident on the pixel array unit 11.

In the case where the light shielding films 241 are formed at the peripheral portions of both the upper surface and the lower surface of the protective glass 231 as described above, incident light causing light (secondary light, tertiary light and the like) via multiple reflections inside the protective glass 231 is blocked by the light shielding films 241 as described with FIG. 11. As a result, it is possible to further prevent a ghost from occurring.

Note that the light shielding films 241 can be formed on only one of the upper surface and the lower surface of the protective glass 231, besides being formed on both the upper surface and the lower surface of the protective glass 231.

Moreover, the light shielding films 241 can be applied to, for example, a protective glass with a rectangular cross-sectional shape, like the protective glass 201 (FIG. 7), and the like besides a protective glass with a trapezoidal cross-sectional shape, like the protective glass 231.

Furthermore, the light shielding films 241 can be applied to the protective glass 211 to which the IRCF films 221 (FIG. 12) are attached.

<Seventh Configuration Example of Image Sensor 2>

Figure 15:
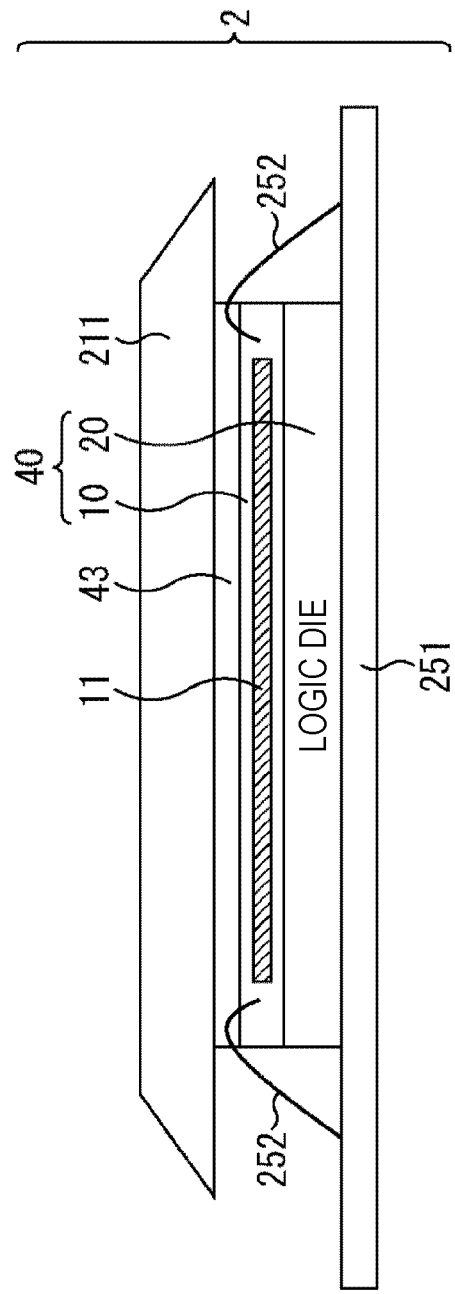
FIG. 15 is a cross-sectional view showing a seventh configuration example of the image sensor 2.

FIG. 15 is a cross-sectional view showing a seventh configuration example of the image sensor 2.

Note that portions in the drawing corresponding to those in FIG. 11 are denoted by the same reference signs, and the descriptions thereof will be omitted as appropriate hereinafter.

In FIG. 15, the image sensor 2 has a sensor chip 40 with a laminate structure of two layers of a sensor die 10 and a logic die 20, a protective glass 211 and wires 252. Moreover, in the image sensor 2 in FIG. 15, the protective glass 211 is affixed to the sensor chip 40 by an adhesive 43.

Therefore, the image sensor 2 in FIG. 15 is common to the case in FIG. 11 in that the image sensor 2 has the sensor chip 40 and the protective glass 211.

However, the image sensor 2 in FIG. 15 is different from the case in FIG. 11 in that the wires 252 are provided instead of the electrodes 42.

In the image sensor 2 in FIG. 11, the electrodes 42 are formed under the sensor chip 40, and the image sensor 2 can be mounted by flip chip.

On the other hand, the electrodes 42 are not formed in the image sensor 2 in FIG. 15, and the image sensor 2 is mounted by wire bonding.

That is, the sensor chip 40 and a substrate 251 constituting the package of the image sensor 2 are electrically connected by the wires 252 including aluminum, copper, or the like.

Like the image sensor 2 in FIG. 11 executed by flip chip, it is possible to prevent a ghost from occurring also in the image sensor 2 mounted by wire bonding.

Note that, instead of the protective glass 211, for example, the protective glass 201 in FIG. 7, the protective glass 211 to which the IRCF films 221 are attached in FIG. 12, the protective glass 231 in FIG. 13, the protective glass 231 on which the light shielding films 241 are formed in FIG. 14, or any other combination of the protective glasses of the configuration examples of the image sensor 2 described above can be adopted in the image sensor 2 mounted by wire boding in FIG. 15.

Moreover, in the image sensor 2 mounted by wire bonding in FIG. 15, the wires 252 connected to the sensor chip 40 are drawn out to positions slightly higher than the upper surface of the sensor chip 40 from the sensor chip 40 and connected to the substrate 251 as shown in FIG. 15.

Since the wires 252 are drawn out to the positions slightly higher than the upper surface of the sensor chip 40 from the sensor chip 40 in the image sensor 2 mounted by wire bonding as described above, the wires 252 slightly protrude from the upper surface of the sensor chip 40.

The image sensor 2 mounted by wire bonding needs a gap at the upper side of the sensor chip 40, that is, between the sensor chip 40 and the protective glass 211 so as not to hinder the wires 252 from protruding from the upper surface of the sensor chip 40.

Thereupon, in the image sensor 2 mounted by wire bonding, the thickness of the adhesive 43 which affixes the sensor chip 40 and the protective glass 211 is adjusted so that protrusion of the wires 252 can be secured.

Alternatively, a step is provided at the lower surface of the protective glass 211 so that the protrusion of the wires 252 can be secured.

By adjusting the thickness of the adhesive 43 or by providing the step at the protective glass 211 as described above, it is possible to secure the protrusion of the wires 252 and affix the protective glass 211 larger than the sensor chip 40 in size to the sensor chip 40. Therefore, it is possible to prevent a ghost from occurring in the image sensor 2 mounted by wire bonding.

Note that the surroundings of the wires 252 are filled with the adhesive 43 in the image sensor 2 mounted by wire bonding in a case where the thickness of the adhesive 43, which affixes the sensor chip 40 and the protective glass 211, is adjusted so that the protrusion of the wires 252 can be secured.

In this case, incident light which have passed through the protective glass 211 does not directly hit the wires 252. That is, since the light hitting the wires 252 needs to penetrate the adhesive 43 used to fill the surroundings of the wires 252, the light is not the incident light itself passed through the protective glass 211 but the light that has passed through at least the adhesive 43.

Since the incident light passed through the protective glass 211 do not directly hit the wires 252 in the image sensor 2 mounted by wire boing as described above, it is possible to suppress a ghost occurring due to the light reflected by the wires 252 as compared with a case where the incident light passed through the protective glass 211 directly hits the wires 252.

Moreover, since the wires 252 are drawn out from the peripheral portions of the sensor chip 40 in FIG. 15, it is possible to prevent a ghost occurring due to the light reflected by the wires 252 by forming the light shielding films 241 at the peripheral portion of the protective glass 211 to block the incidence of the light on the wires 252 as shown in FIG. 14.

<Eighth Configuration Example of Image Sensor 2>

Figure 16:
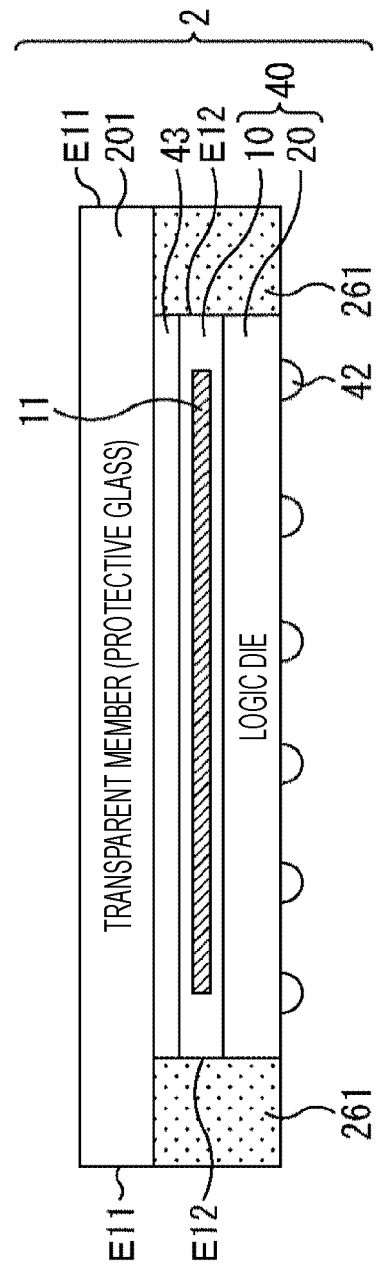
FIG. 16 is a cross-sectional view showing an eighth configuration example of the image sensor 2.

FIG. 16 is a cross-sectional view showing an eighth configuration example of the image sensor 2.

Note that portions in the drawing corresponding to those in FIG. 7 are denoted by the same reference signs, and the descriptions thereof will be omitted as appropriate hereinafter.

In FIG. 16, the image sensor 2 has a sensor chip 40 with a laminate structure of two layers of a sensor die 10 and a logic die 20, electrodes 42 and a protective glass 201. Moreover, in the image sensor 2 in FIG. 16, the protective glass 201 is affixed to the sensor chip 40 by an adhesive 43.

Therefore, the image sensor 2 in FIG. 16 is common to the case in FIG. 11 in that the image sensor 2 has the sensor chip 40, the electrodes 42 and the protective glass 201.

However, the surroundings of the sensor chip 40 are filled with a resin 261 which seals the surroundings of the sensor chip 40 in the image sensor 2 in FIG. 16, which is different from the case in FIG. 7 in which the resin 261 is not used to fill.

In FIG. 16, the resin 261 is a light shielding resin having a light shielding property and is used to fill between positions of end surfaces E11 of the protective glass 201 and positions of end surfaces E12 of the sensor chip 40 in the horizontal direction. Moreover, the resin 261 is used to fill between the position of the lower surface of the protective glass 201 and the position of the lower surface of the sensor chip 40 in the vertical direction.

By filling with the resin 261, it is possible to protect a portion of the protective glass 201 larger than the sensor chip 40 in size projecting from the sensor chip 40 viewed from the top, and the image sensor 2 can be easily handled.

That is, for example, the chipping of the end portion of the protective glass 201 (e.g., chipping of the corner portion) is suppressed, and the handling of the image sensor 2 at the time of mounting the optical system 1 on the image sensor 2 can be facilitated.

<Ninth Configuration Example of Image Sensor 2>

Figure 17:
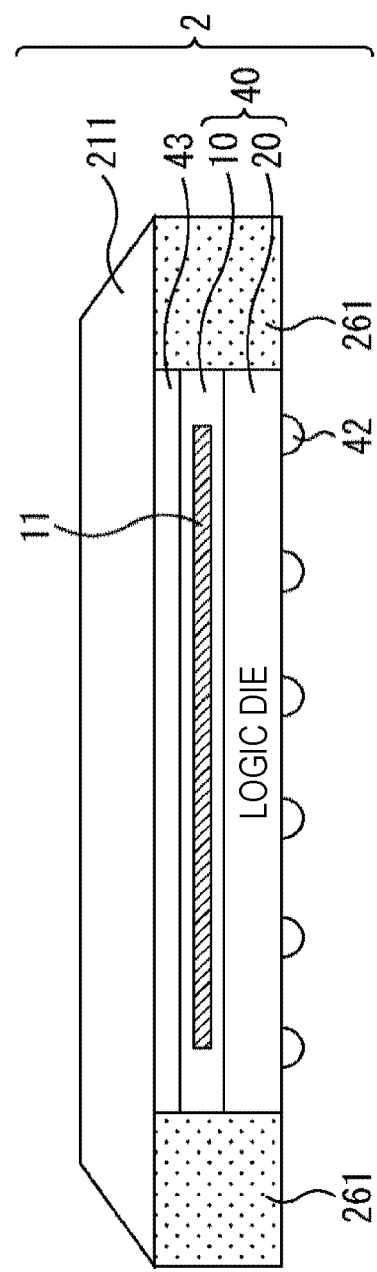
FIG. 17 is a cross-sectional view showing a ninth configuration example of the image sensor 2.

FIG. 17 is a cross-sectional view showing a ninth configuration example of the image sensor 2.

Note that portions in the drawing corresponding to those in FIG. 11 or 16 are denoted by the same reference signs, and the descriptions thereof will be omitted as appropriate hereinafter.

In FIG. 17, the image sensor 2 has a sensor chip 40 with a laminate structure of two layers of a sensor die 10 and a logic die 20, electrodes 42 and a protective glass 211. Moreover, in the image sensor 2 in FIG. 17, the protective glass 211 is affixed to the sensor chip 40 by an adhesive 43.

Therefore, the image sensor 2 in FIG. 17 is common to the case in FIG. 11 in that the image sensor 2 has the sensor chip 40, the electrodes 42 and the protective glass 211.

However, the surroundings of the sensor chip 40 are filled with a resin 261 as described with FIG. 16 in the image sensor 2 in FIG. 17, which is different from the case in FIG. 11 in which the resin 261 is not used to fill.

Like the case in FIG. 16, by filling with the resin 261 also in the image sensor 2 in FIG. 17, it is possible to protect a portion of the protective glass 211 larger than the sensor chip 40 in size projecting from the sensor chip 40, and the image sensor 2 can be easily handled.

<Tenth Configuration Example of Image Sensor 2>

Figure 18:
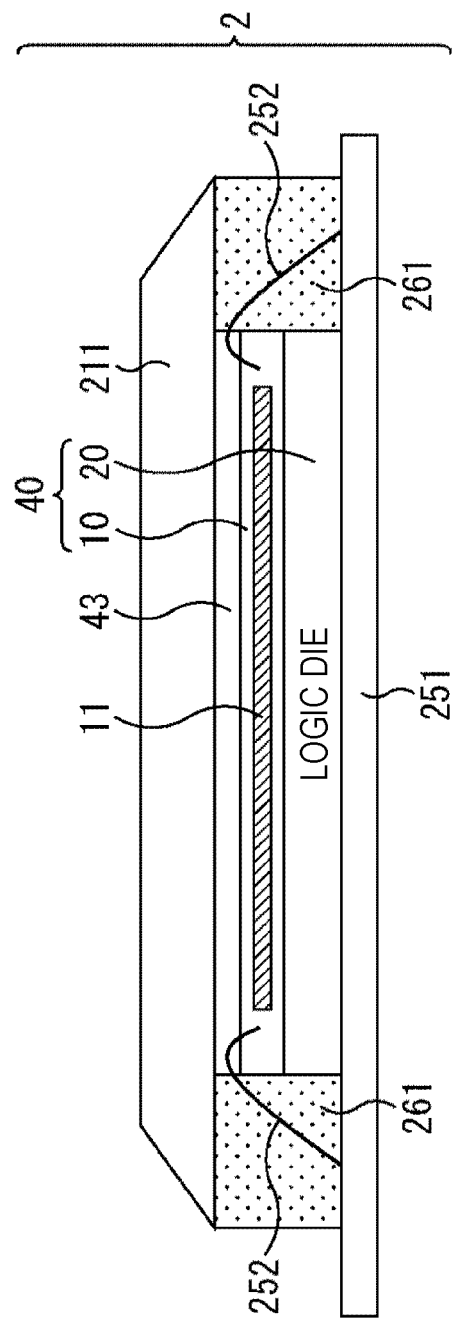
FIG. 18 is a cross-sectional view showing a tenth configuration example of the image sensor 2.

FIG. 18 is a cross-sectional view showing a tenth configuration example of the image sensor 2.

Note that portions in the drawing corresponding to those in FIG. 15 or 16 are denoted by the same reference signs, and the descriptions thereof will be omitted as appropriate hereinafter.

In FIG. 18, the image sensor 2 has a sensor chip 40 with a laminate structure of two layers of a sensor die 10 and a logic die 20, a protective glass 211 and wires 252. Moreover, in the image sensor 2 in FIG. 18, the protective glass 211 is affixed to the sensor chip 40 by an adhesive 43, and the wires 252 electrically connect the sensor chip 40 and a substrate 251.

Therefore, the image sensor 2 in FIG. 18 is common to the case in FIG. 15 in that the image sensor 2 has the sensor chip 40, the protective glass 211 and the wires 252.

However, the surroundings of the sensor chip 40 are filled with a resin 261 as described with FIG. 16 in the image sensor 2 in FIG. 18, which is different from the case in FIG. 15 in which the resin 261 is not used to fill.

Like the case in FIG. 16, by filling with the resin 261 also in the image sensor 2 in FIG. 18, it is possible to protect a portion of the protective glass 211 larger than the sensor chip 40 in size projecting from the sensor chip 40, and the image sensor 2 can be easily handled.

Note that the image sensors 2 in FIGS. 16 to 18 are the image sensors 2 in which the image sensors 2 in FIGS. 7, 11 and 15 are filled with the resin 261, and the filling with the resin 261 can be applied to others, for example, the image sensors 2 in FIGS. 12 to 14 and the like.

<Manufacturing Method of Image Sensor 2>

Figure 19:
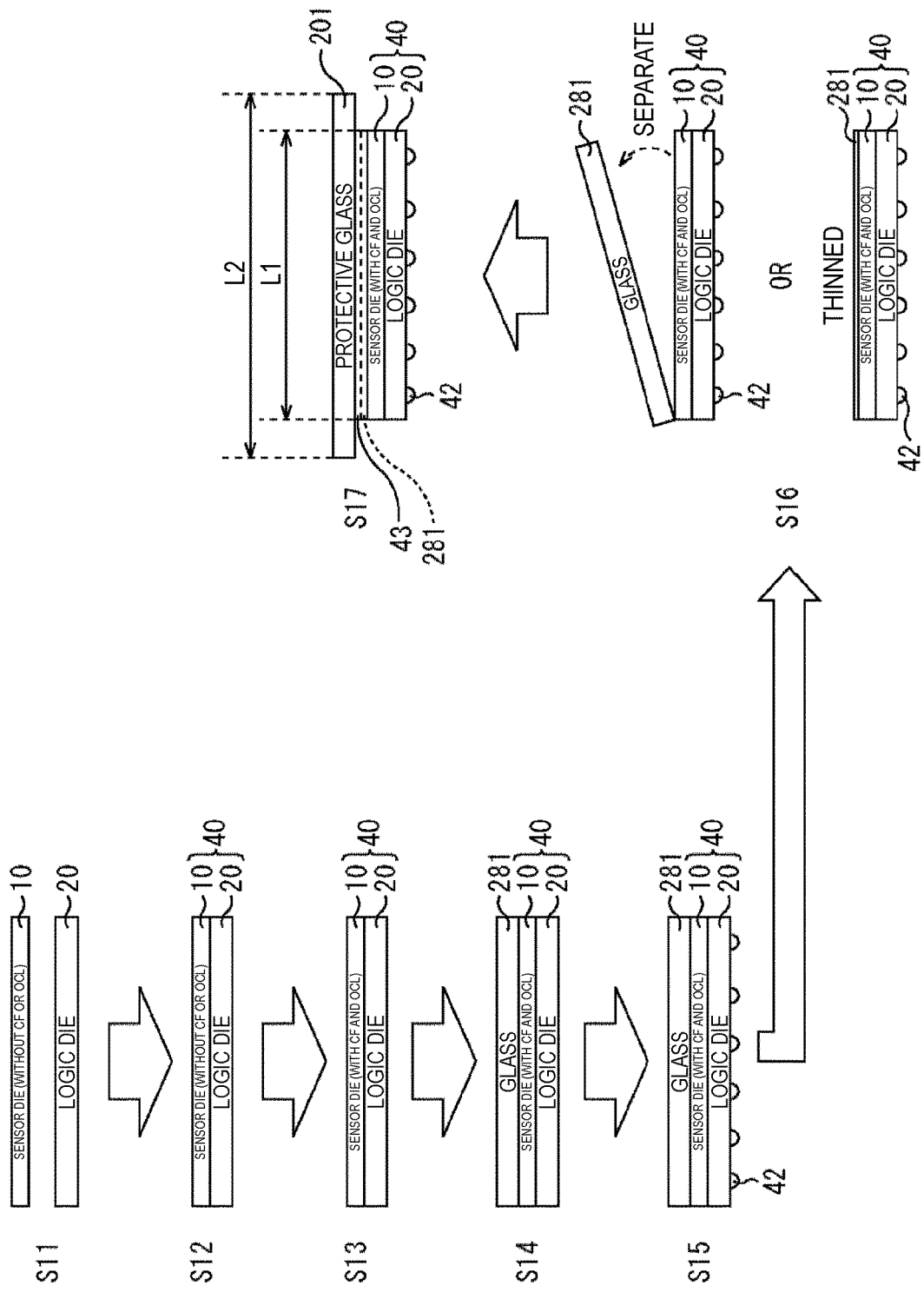
FIG. 19 is a diagram illustrating an example of a manufacturing method of the image sensor 2.

FIG. 19 is a diagram illustrating an example of a manufacturing method of the image sensor 2.

That is, FIG. 19 shows an example of a manufacturing method of the image sensor 2 in FIG. 7.

In Step S11, a manufacturing apparatus (not shown) which manufactures the image sensor 2 manufactures the sensor die 10 and the logic die 20 (wafers to become each).

In Step S12, the manufacturing apparatus affixes the sensor die 10 and the logic die 20 and manufactures the sensor chip 40.

In Step S13, the manufacturing apparatus electrically connects the sensor die 10 and the logic die 20 by forming the chip through electrode 105, the connecting wire 106, the insulating films 107 and the like in the sensor chip 40 (FIG. 4). Moreover, the manufacturing apparatus forms the OCLs 111 and the CFs 112 on the sensor die 10.

In Step S14, the manufacturing apparatus affixes, for example, a glass 281 serving as a supporting substrate, which supports the sensor chip 40, to the upper side (sensor die 10 side) of the sensor chip 40 (or performs temporary bonding). Herein, for example, a Si substrate or the like can be adopted as the supporting substrate besides the glass 281.

In Step S15, the manufacturing apparatus forms the back surface wires (not shown) connected to the electrodes 42 and the electrodes 42 on the sensor chip 40 supported by the glass 281 serving as the supporting substrate.

In Step S16, the manufacturing apparatus thins the glass 281 serving as the supporting substrate by polishing, etching or the like. Alternatively, the manufacturing apparatus separates the glass 281 serving as the supporting substrate from the sensor chip 40.

In Step S17, the manufacturing apparatus affixes the protective glass 201 with a size L2 larger than a size L1 of the sensor chip 40 directly or through the thinned glass 281 to the sensor chip 40 and completes the image sensor 2 in FIG. 7.

Note that the processings in Steps S11 to S17 can be performed at the wafer level.

However, in the case of attaching the IRCF films 221 (FIG. 12) to the protective glass 201 or in the case of adopting, for example, the protective glass 231 (FIG. 13) having the function of the IRCF instead of the protective glass 201, it is possible to perform the processings in Steps S11 to S16 at the wafer level and perform the processing in S17 after dicing (singulation).

Figure 20:
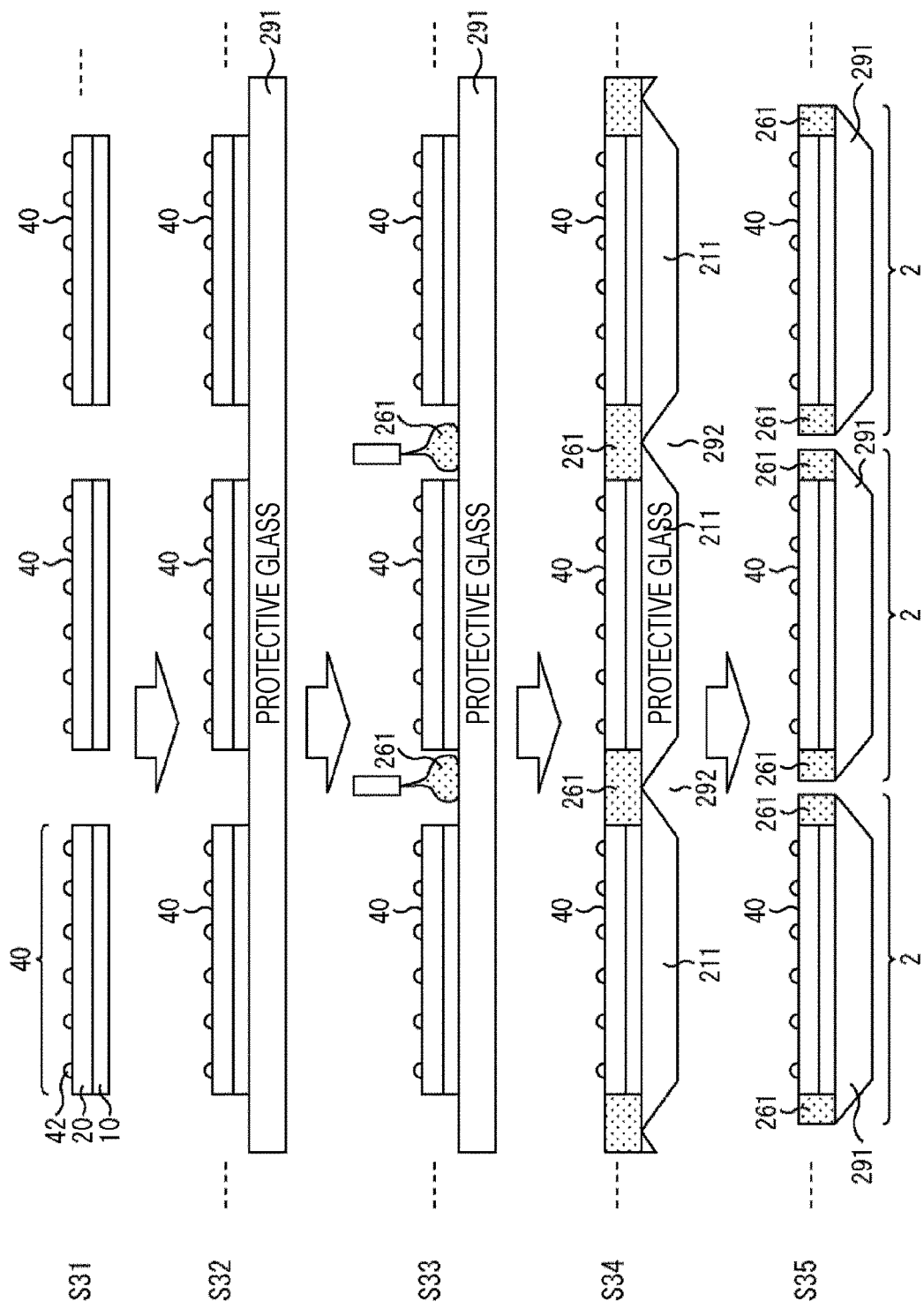
FIG. 20 is a diagram illustrating another example of the manufacturing method of the image sensor 2.

FIG. 20 is a diagram illustrating another example of the manufacturing method of the image sensor 2.

That is, FIG. 20 shows an example of a manufacturing method of the image sensor 2 in FIG. 17.

Note that the case of attaching the IRCF films 221 (FIG. 12) to the protective glass 211 or the case of adopting, for example, the protective glass 231 (FIG. 13) having the function of the IRCF instead of the protective glass 211 is not taken into consideration in FIG. 20 to simplify the explanation.

In Step S31, a manufacturing apparatus (not shown) which manufactures the image sensor 2 manufactures and singulates the sensor chip 40.

In Step S32, the manufacturing apparatus affixes the sensor chip 40 singulated to the protective glass 291 which will later become the protective glass 211 (FIG. 11) at a predetermined pitch.

In Step S33, the manufacturing apparatus fills the surroundings of the sensor chips 40 on the protective glass 291, to which the sensor chips 40 are affixed, with the resin 261 so as to seal the sensor chips 40.

In Step S34, the manufacturing apparatus forms triangular grooves 292 so as to taper portions of the protective glass 291 facing the surroundings of the sensor chips 40.

In Step S35, the manufacturing apparatus performs the singulation with the vertices of the triangular grooves 292 as boundaries of the singulation and completes the image sensor 2 in FIG. 17.

By affixing the protective glass 201, 211 or 231 larger than the sensor chip 40 in size to the sensor chip 40 in which the distance A between the end surface of the sensor chip 40 and the pixel array unit 11 (FIG. 7) is shortened as a result of the miniaturization of wirings and the like as described above, it is possible to prevent a ghost from occurring even when the thickness of the protective glass 201 or the like is set to the thickness that can secure the mechanical rigidity required.

Moreover, by affixing the protective glass 211 or 231 with the trapezoidal cross-sectional shape to the sensor chip, it is possible to prevent a ghost from occurring due to the light (secondary light, tertiary light and the like) via multiple reflections inside the protective glass 211 and the like.

Furthermore, by depositing the IRCF films 221 (FIG. 12) on the protective glass 211 or adopting the protective glass 231 which absorbs infrared rays and functions as the IRCF, it is possible to configure a thin camera unit without additionally providing an IRCF.

Further, in the case of adopting the protective glass 211 on which the IRCF films 221 are deposited or the protective glass 231 which absorbs infrared rays and functions as the IRCF, the protective glass 211 or 231 and the sensor chip 40 are both singulated, and the protective glass 211 or 231 and the sensor chip 40 are affixed after selecting good pieces. Thus, it is possible to improve the yield of the image sensor 2 as well as suppress the manufacturing costs.

<Usage Example of Image Sensor>

Figure 21:
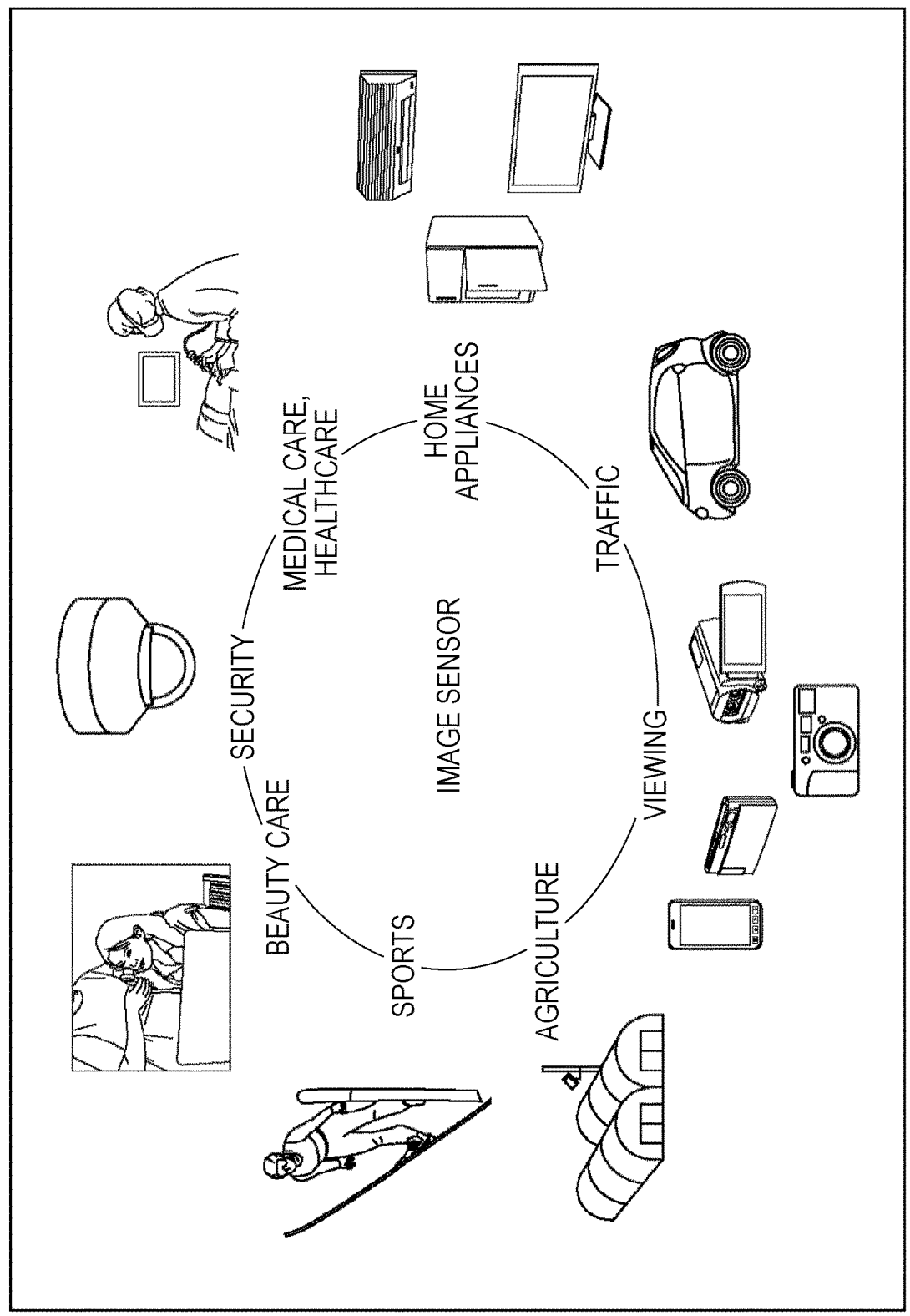
FIG. 21 is a diagram showing a usage example of using the image sensor 2.

FIG. 21 is a diagram showing a usage example of using the aforementioned image sensor 2.

The aforementioned image sensor 2 (and further, the camera unit in FIG. 1 having the image sensor 2) can be used in, for example, various apparatuses (electronic devices) which sense light such as visible light, infrared light, ultraviolet light and X-rays as described below.

- An apparatus, such as a digital camera or a portable device with a camera function, which shoots an image to be used for viewing
- An apparatus used for traffic, such as an in-vehicle sensor which shoots the front, rear, surroundings, inside and the like of an automobile, a surveillance camera which monitors traveling vehicles and roads, or a distance measuring sensor which measures the distance between the vehicles, for safe driving with, for example, automatic stop, recognition of driver's condition, and the like.
- An apparatus used for home appliances such as a TV, a refrigerator or an air conditioner for shooting user's gesture to perform device operation according to that gesture.

An apparatus used for medical care and healthcare, such as an endoscope, an electron microscope or a device for performing angiography by receiving infrared light.

An apparatus used for security, such as a surveillance camera used for crime prevention or a camera for personal authentication use.

An apparatus used for beauty care, such as a skin measuring instrument which shoots skin or a microscope which shoots a scalp.

An apparatus used for sports, such as an action camera or a wearable camera for sports applications and the like.

An apparatus used for agriculture, such as a camera for monitoring the conditions of fields and crops.

The embodiments of the present technology have been described above, and the embodiments of the present technology are not limited to the above embodiments.

Various modifications can be made in a scope without departing from the gist of the present technology.

In addition, the effects described in the present description are merely examples and are not limited, and other effects may be provided.

Note that the present technology may also adopt the following configurations.

<1>
An image sensor including:
a sensor chip having a pixel array unit in which pixels that perform photoelectric conversion are arrayed; and
a plate-like transparent member, is affixed to a side of the pixel array unit of the sensor chip and is larger than the sensor chip in size.

<2>
The image sensor according to <1>, in which the transparent member is a transparent member with a trapezoidal cross-sectional shape.

<3>
The image sensor according to <1> or <2>, further including an infrared cult filter (IRCF) film which is attached to the transparent member.

<4>
The image sensor according to <1> or <2>, in which the transparent member is a transparent member which absorbs infrared rays.

<5>
The image sensor according to any one of <1> to <4>, in which the image sensor is mounted by wire bonding or flip chip.

<6>
The image sensor according to any one of <1> to <5>, further including a light shielding film which is formed on a peripheral portion of the transparent member.

<7>
The image sensor according to any one of <1> to <6>, further including a resin which seals surroundings of the sensor chip.

<8>
The image sensor according to any one of <1> to <7>, in which a thickness of the transparent member is 200 μm or more.

<9>
A manufacturing method including:
a step of affixing a plate-like transparent member to a side of a pixel array unit of a sensor chip, the chip having the pixel array unit in which pixels that perform photoelectric conversion are arrayed,
in which an image sensor, in which the sensor chip and the transparent member larger than the sensor chip in size are affixed, is manufactured.

<10>
An electronic device including:
an optical system which collects light; and
an image sensor which receives the light and captures an image,
in which the image sensor includes:
a sensor chip having a pixel array unit in which pixels that perform photoelectric conversion are arrayed; and
a plate-like transparent member is affixed to a side of the pixel array unit of the sensor chip and is larger than the sensor chip in size.

REFERENCE SIGNS LIST

1 Optical system
2 Image sensor
3 Memory
4 Signal processing unit
5 Output unit
6 Control unit
10 Sensor die
11 Pixel array unit
12 Peripheral circuit
20 Logic die
30 Memory die
40 Sensor chip
41 Protective glass
42 Electrode
43 Adhesive
101 Semiconductor substrate
102 (Multilayer) wiring layer
103 Wiring layer
104 Interlayer insulating film
105 Chip through electrode
106 Connecting wire
107, 108 Insulating film
109 Silicon through electrode
110 PD
111 OCL
112 CF
121 Silicon substrate
122 (Multilayer) wiring layer
123 Wiring layer
124 Interlayer insulating film
201, 211 Protective glass
221 IRCF film
231 Protective glass
241 Light shielding film
251 Substrate
252 Wire
261 Resin
281 Glass
291 Protective glass
292 Groove

The invention claimed is:
1. A package, comprising:
a sensor chip having a pixel array unit in which pixels that perform photoelectric conversion are arrayed;
a plate-like transparent member provided above the pixel array unit on a second side of the sensor chip, the plate-like transparent member being larger than the sensor chip in size; and
a resin region including resin material provided around side wall portions of the sensor chip,
wherein a length in a horizontal direction of a first side of the plate-like transparent member affixed to the second side of the sensor chip is longer than a length in the horizontal direction of a second side of the plate-like transparent member.

2. The package according to claim 1, further comprising an adhesive layer provided between the plate-like transparent member and the sensor chip.

3. The package according to claim 1, wherein end portions of the plate-like transparent member extend over the side wall portions of the sensor chip.

4. The package according to claim 1, further comprising electrodes provided on a first side of the sensor chip opposite to the second side of the sensor chip.

5. The package according to claim 2, wherein the adhesive layer affixes the plate-like transparent member with the second side of the sensor chip.

6. The package according to claim 4, wherein the resin region includes a first side and a second side, the second side of the resin region being in contact with the plate-like transparent member and the first side of the resin region being free of the electrodes.

7. The package according to claim 1, wherein the package is mounted by flip chip.

8. The package according to claim 1, wherein an edge of the plate-like transparent member is coincident with an edge of the package.

9. The package according to claim 1, wherein the resin region includes a light shielding resin having a light shielding property.

10. A package, comprising:
a glass substrate;
a supporting substrate;
a wiring layer formed over a second side of the supporting substrate;
a semiconductor substrate formed over the wiring layer and having a second side as a light-incident side and a first side opposite to the second side;
an adhesive layer between the glass substrate and the second side of the semiconductor substrate; and
a resin region including resin material provided around side wall portions of the semiconductor substrate, the wiring layer and the supporting substrate,
wherein a length in a horizontal direction of a first side of the glass substrate affixed to the second side of the semiconductor substrate is longer than a length in the horizontal direction of a second side of the glass substrate.

11. The package according to claim 10, further comprising a lens layer provided at the second side of the semiconductor substrate.

12. The package according to claim 11, further comprising a color filter layer provided between the second side of the semiconductor substrate and the lens layer.

13. The package according to claim 10, wherein end portions of the glass substrate extend over the side wall portions of the semiconductor substrate, the wiring layer and the supporting substrate.

14. The package according to claim 10, further comprising electrodes provided on a first side of the supporting substrate opposite to the second side of the supporting substrate.

15. The package according to claim 10, wherein the adhesive layer affixes the glass substrate with the second side of the semiconductor substrate.

16. The package according to claim 10, wherein the supporting substrate is a silicon substrate.

17. The package according to claim 14, wherein the resin region includes a first side and a second side, the second side of the resin region being in contact with the first side of the glass substrate and the first side of the resin region being free of the electrodes.

18. The package according to claim 10, wherein the semiconductor substrate includes a pixel array.

19. The package according to claim 10, wherein the package is mounted by flip chip.

20. The package according to claim 10, wherein an edge of the glass substrate is coincident with an edge of the package.

21. The package according to claim 10, wherein the resin region includes a light shielding resin having a light shielding property.

22. A manufacturing method of a package, comprising:
affixing a plate-like transparent member to a second side of a pixel array unit of a sensor chip, the sensor chip having the pixel array unit in which pixels that perform photoelectric conversion are arrayed, the transparent plate-like member being larger than the sensor chip in size; and
forming a resin region including resin material provided around side wall portions of the sensor chip,
wherein a length in a horizontal direction of a first side of the plate-like transparent member affixed to the second side of the pixel array unit of the sensor chip is longer than a length in the horizontal direction of a second side of the plate-like transparent member.

23. The manufacturing method according to claim 22, further comprising affixing electrodes on a first side of the sensor chip opposite to the second side of the sensor chip.

24. The manufacturing method according to claim 23, further comprising affixing a second side of the resin region to the plate-like transparent member and maintaining a first side of the resin region to be free of the electrodes.

25. The manufacturing method according to claim 22, wherein the resin region includes a light shielding resin having a light shielding property.

26. The manufacturing method according to claim 22, wherein an edge of the plate-like transparent member is coincident with an edge of the resin region.

* * * * *